United States Patent
Ko et al.

(10) Patent No.: US 12,069,897 B2
(45) Date of Patent: Aug. 20, 2024

(54) ORGANIC LIGHT-EMITTING DIODE (OLED) DISPLAY HAVING A SEMICONDUCTOR LAYER INCLUDING A THIRD PORTION EXTENDING IN A THIRD DIRECTION JOINING A FIRST AND SECOND PORTIONS THAT EXTENDING IN DIFFERENT DIRECTIONS

(71) Applicant: SAMSUNG DISPLAY CO., LTD., Yongin-si (KR)

(72) Inventors: Moo Soon Ko, Seoul (KR); Jung Hwa Kim, Gunpo-si (KR); Min Woo Woo, Bucheon-si (KR); Wang Woo Lee, Osan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/936,899

(22) Filed: Sep. 30, 2022

(65) Prior Publication Data
US 2023/0024556 A1 Jan. 26, 2023

Related U.S. Application Data

(63) Continuation of application No. 15/139,228, filed on Apr. 26, 2016, now abandoned.

(30) Foreign Application Priority Data

May 4, 2015 (KR) .......................... 10-2015-0062597

(51) Int. Cl.
*H01L 27/12* (2006.01)
*H10K 59/121* (2023.01)
(Continued)

(52) U.S. Cl.
CPC ..... *H10K 59/1213* (2023.02); *H01L 27/1222* (2013.01); *H01L 27/124* (2013.01);
(Continued)

(58) Field of Classification Search
CPC .. H01L 27/1222; H01L 27/124; H10K 59/131
See application file for complete search history.

(56) References Cited

U.S. PATENT DOCUMENTS 6,307,322 B1 10/2001 Dawson et al.
9,711,585 B2 * 7/2017 Kim ...................... H10K 59/12
(Continued)

FOREIGN PATENT DOCUMENTS

EP 2372683 10/2011
EP 2983205 2/2016
(Continued)

OTHER PUBLICATIONS

Extended European Search Report dated Sep. 12, 2016 for European Patent Appln. No. EP 16 168 446.9, which shares priority of Korean Patent Appln. No. KR 10-2015-0062597 with U.S. Appl. No. 15/139,228.

(Continued)

*Primary Examiner* — Anh D Mai
(74) *Attorney, Agent, or Firm* — F. Chau & Associates, LLC

(57) ABSTRACT

An organic light-emitting diode display is disclosed. In one aspect, a semiconductor layer is on a substrate, and the semiconductor layer is non-linear. A gate metal line is on the semiconductor layer, and an insulating layer covering the semiconductor layer and the gate metal line and having a plurality of contact holes connected to the semiconductor layer. A data metal line is on the insulating layer and electrically connected to the semiconductor layer via a selected one of the contact holes. An OLED is electrically (Continued)

connected to the gate metal line and the data metal line, and the semiconductor layer includes a narrow semiconductor layer having a first width and an expansion semiconductor layer formed adjacent to the selected contact hole and having a second width greater than the first width.

11 Claims, 15 Drawing Sheets

(51) Int. Cl.
    *H10K 59/131* (2023.01)
    *H10K 59/35* (2023.01)
    *H10K 59/38* (2023.01)
(52) U.S. Cl.
    CPC ......... *H10K 59/121* (2023.02); *H10K 59/131* (2023.02); *H10K 59/352* (2023.02); *H10K 59/353* (2023.02); *H10K 59/38* (2023.02)

(56) References Cited

U.S. PATENT DOCUMENTS

| | | |
|---|---|---|
| 2003/0022589 A1 | 12/2003 | Osame et al. |
| 2008/0246026 A1 | 10/2008 | Kim |
| 2014/0034923 A1 | 2/2014 | Kim et al. |
| 2014/0070184 A1 | 3/2014 | Shin |
| 2014/0098078 A1 | 4/2014 | Jeon et al. |
| 2014/0353629 A1 | 12/2014 | Jin |
| 2015/0021561 A1 | 1/2015 | Jeon |
| 2015/0102303 A1 | 4/2015 | Kim |
| 2015/0170563 A1 | 6/2015 | Bang |
| 2015/0228223 A1 | 8/2015 | Park |
| 2016/0012775 A1 | 1/2016 | Jeong et al. |
| 2016/0233285 A1 | 8/2016 | Lee |
| 2016/0329391 A1 | 11/2016 | Ko et al. |

FOREIGN PATENT DOCUMENTS

| | | |
|---|---|---|
| JP | 11-133463 | 5/1999 |
| JP | 3512561 | 1/2004 |
| JP | 4481271 | 3/2010 |
| KR | 10-2013-0139059 | 12/2013 |
| KR | 10-2014-0053601 | 5/2014 |

OTHER PUBLICATIONS

Office Action dated Sep. 8, 2021 in corresponding U.S. Appl. No. 15/139,228.
Final Office Action dated May 3, 2021 in corresponding U.S. Appl. No. 15/139,228.
Final Office Action dated Jun. 29, 2020 in corresponding U.S. Appl. No. 15/139,228.
Office Action dated Apr. 22, 2020 in corresponding U.S. Appl. No. 15/139,228.
Final Office Action dated Mar. 28, 2019 in corresponding U.S. Appl. No. 15/139,228.
Office Action dated Sep. 25, 2018 in corresponding U.S. Appl. No. 15/139,228.

* cited by examiner

ORGANIC LIGHT-EMITTING DIODE (OLED) DISPLAY HAVING A SEMICONDUCTOR LAYER INCLUDING A THIRD PORTION EXTENDING IN A THIRD DIRECTION JOINING A FIRST AND SECOND PORTIONS THAT EXTENDING IN DIFFERENT DIRECTIONS

CROSS-REFERENCE TO RELATED APPLICATIONS

This application is a Continuation of co-pending U.S. patent application Ser. No. 15/139,228, filed on Apr. 26, 2016, which claims priority to and the benefit of Korean Patent Application No. 10-2015-0062597 filed in the Korean Intellectual Property Office on May 4, 2015, the entire contents of which are incorporated herein by reference.

BACKGROUND

1. Field

The described technology generally relates to an organic light-emitting diode display.

2. Description of the Related Art

An organic light-emitting diode (OLED) includes two electrodes and an interposed organic light emitting layer. Electrons injected from a cathode electrode and holes injected from an anode electrode are bonded to each other in the organic light emitting layer to form excitons. Light is emitted while the excitons discharge energy.

An OLED display includes a matrix of pixels, and each pixel includes a plurality of thin film transistors and capacitors for driving the OLED. The transistors typically include a switching transistor and a driving transistor.

As demand increases for higher resolution, the size of a pixel shrinks such that process margin decreases. Accordingly, defects due to a change in the width of wires, a change in the size of contact holes, or an alignment error can be easily generated. That is, as the resolution increases, the actual wires have a smaller width than the predetermined and designed wires in a product, and the contact holes that are actually formed in the product can be formed larger than the predetermined and designed contact holes, or an inter-layer alignment error can easily increase.

When etchant used to etch a data metal line penetrates a semiconductor member exposed by a misaligned contact hole, the semiconductor member can be opened. Therefore, since the pixel in the opened semiconductor member does not emit light and the pixel in the non-opened semiconductor member does emit light, non-uniform lighting between adjacent pixels results.

The above information disclosed in this Background section is only for enhancement of understanding of the background of the disclosure and therefore it can contain information that does not constitute the prior art that is already known in this country to a person of ordinary skill in the art.

SUMMARY OF CERTAIN INVENTIVE ASPECTS

One inventive aspect relates to an OLED display that can prevent disconnection of the semiconductor member in a high resolution structure.

Another aspect is an organic light-emitting diode (OLED) display, comprising: a substrate; a semiconductor layer on the substrate, wherein the semiconductor layer is non-linear; a gate metal line on the semiconductor layer; an insulating layer covering the semiconductor layer and the gate metal line and having a plurality of contact holes connected to the semiconductor layer; a data metal line on the insulating layer and electrically connected to the semiconductor layer via a selected one of the contact holes; and an OLED electrically connected to the gate metal line and the data metal line, wherein the semiconductor layer includes a narrow semiconductor part having a first width and an expansion semiconductor part formed adjacent to the selected contact hole and having a second width greater than the first width.

In the above OLED display, the expansion semiconductor part encloses the selected contact hole.

In the above OLED display, the expansion semiconductor part includes a contact semiconductor region overlapping the selected contact hole and a non-contact semiconductor region not overlapping the selected contact hole, in the depth dimension of the OLED display, wherein edges of the expansion semiconductor part are separated from edges of the selected contact hole in the non-contact semiconductor region.

The above OLED display further comprises: a scan line on the substrate and configured to transmit a scan signal; a data line and a driving voltage line crossing the scan line and configured to respectively transmit a data voltage and a driving voltage; a switching transistor electrically connected to the scan line and the data line; a driving transistor electrically connected to the switching transistor and including a portion of the semiconductor layer as a driving channel, a driving gate electrode overlapping the driving channel in the depth dimension of the OLED display, and driving source and drain electrodes located at the ends of the driving channel; a compensation transistor including another portion of the semiconductor layer as a compensation channel, a compensation gate electrode overlapping the compensation channel in the depth dimension of the OLED display, and compensation source and drain electrodes located at opposing ends of the compensation channel, wherein the compensation source electrode is electrically connected to the driving drain electrode; and a driving connector configured to electrically connect the compensation drain electrode to the driving gate electrode, wherein the gate metal line includes the scan line, and wherein the data metal line includes the driving connector.

The above OLED display further comprises: a previous scan line substantially parallel to the scan line and configured to transmit a previous scan signal; an initialization voltage line configured to transmit an initialization voltage configured to initialize the driving transistor; and an initialization transistor configured to be turned on based on the previous scan signal and including an initialization channel and initialization gate, source, and drain electrodes, wherein the expansion semiconductor part includes a first expansion semiconductor layer configured to electrically connect the compensation drain electrode to the initialization drain electrode.

In the above OLED display, the selected contact hole includes a compensation contact hole located where the driving connector and the first expansion semiconductor part overlap each other in the depth dimension of the OLED display.

In the above OLED display, the first expansion semiconductor part includes a first contact semiconductor region overlapping the compensation contact hole and a first non-contact semiconductor region not overlapping the compensation contact hole, in the depth dimension of the OLED display, wherein edges of the first expansion semiconductor part and edges of the compensation contact hole are separated from each other in the first non-contact semiconductor region.

In the above OLED display, the first non-contact semiconductor region is positioned on the shortest path passing in front of the compensation contact hole, wherein the shortest path extends from a vertical portion of the narrow semiconductor part to a horizontal portion of the narrow semiconductor part.

In the above OLED display, the first non-contact semiconductor region is located on a detour path around the compensation contact hole.

In the above OLED display, the data metal line further includes the data line, wherein the expansion semiconductor part further includes a second expansion semiconductor part overlapping the data line.

In the above OLED display, the contact hole further includes a switching contact hole located where the data line and the second expansion semiconductor part overlap each other in the depth dimension of the OLED display.

In the above OLED display, the insulating layer includes: a first gate insulating layer covering the semiconductor layer; a second gate insulating layer covering the scan line; and an interlayer insulating layer covering the second gate insulating layer, and wherein the compensation contact hole and the switching contact hole penetrate the first and second gate insulating layers and the interlayer insulating layer.

In the above OLED display, the OLED includes: a pixel electrode electrically connected to the driving transistor; an organic emission layer on the pixel electrode; and a common electrode on the organic emission layer.

Another aspect is an organic light-emitting diode (OLED) display, comprising: a substrate; a semiconductor layer on the substrate, wherein the semiconductor layer is non-linear; a gate metal line on the semiconductor layer; an insulating layer covering the semiconductor layer and the gate metal line and having a plurality of contact holes connected to the semiconductor layer; a data metal line on the insulating layer and electrically connected to the semiconductor layer via a selected one of the contact holes; and an OLED electrically connected to the gate metal line and the data metal line, wherein the data metal line includes a normal data metal layer having a first width and an expansion data metal part adjacent to the selected contact hole and having a second width greater than the first width.

In the above OLED display, the expansion data metal part encloses the selected contact hole.

In the above OLED display, the semiconductor layer includes a curved semiconductor part adjacent to the selected contact hole and a semiconductor stripe part having a substantially linear shape, wherein the curved semiconductor part overlaps the expansion data metal part in the depth dimension of the OLED display.

In the above OLED display, the expansion data metal part includes a contact data region overlapping the selected contact hole and a non-contact data region not overlapping the selected contact hole, in the depth dimension of the OLED display, wherein edges of the expansion data metal part and the edges of the selected contact hole are separated from each other in the non-contact data region.

The above OLED display further comprises: a scan line on the substrate and configured to transmit a scan signal; a data line and a driving voltage line crossing the scan line and configured to respectively transmit a data voltage and a driving voltage; a switching transistor electrically connected to the scan line and the data line; a driving transistor electrically connected to the switching transistor and including a portion of the semiconductor layer as a driving channel, a driving gate electrode overlapping the driving channel in the depth dimension of the OLED display, and driving source and drain electrodes located at ends of the driving channel; a compensation transistor including another portion of the semiconductor layer as a compensation channel, a compensation gate electrode overlapping the compensation channel in the depth dimension of the OLED display, and compensation source and drain electrodes located at ends of the compensation channel, wherein the compensation source electrode is electrically connected to the driving drain electrode; and a driving connector configured to electrically connect the compensation drain electrode to the driving gate electrode, wherein the gate metal line includes the scan line, and wherein the data metal line includes the driving connector.

In the above OLED display, the contact hole includes a compensation contact hole located where the driving connector and the first expansion semiconductor part overlap each other in the depth dimension of the OLED display.

In the above OLED display, the driving connector includes a driving connection portion having a first width and a driving expansion part adjacent to the compensation contact hole and having a second width greater than the first width.

In the above OLED display, the driving expansion part includes a contact data region overlapping the compensation contact hole and a non-contact data region not overlapping the compensation contact hole, in the depth dimension of the OLED display, and wherein edges of the driving expansion part and edges of the compensation contact hole are separated from each other in the non-contact data region.

In the above OLED display, the insulating layer includes: a first gate insulating layer covering the semiconductor layer; a second gate insulating layer covering the scan line; and an interlayer insulating layer covering the second gate insulating layer, wherein the compensation contact hole penetrates the first and second gate insulating layers and the interlayer insulating layer.

According to at least one of the disclosed embodiments, by forming the expansion semiconductor part at the position corresponding to the contact hole among the semiconductor layer to have the larger width than the narrow semiconductor part, the current movement path can be sufficiently obtained in the expansion semiconductor part. Accordingly, the opening of the expansion semiconductor part that can be generated by the penetration of the etchant for the data metal line through the contact hole due to the interlayer alignment error can be prevented.

Therefore, the non-uniform lighting between adjacent pixels can be prevented in the high resolution structure.

DETAILED DESCRIPTION OF CERTAIN INVENTIVE EMBODIMENTS

Figure 1:
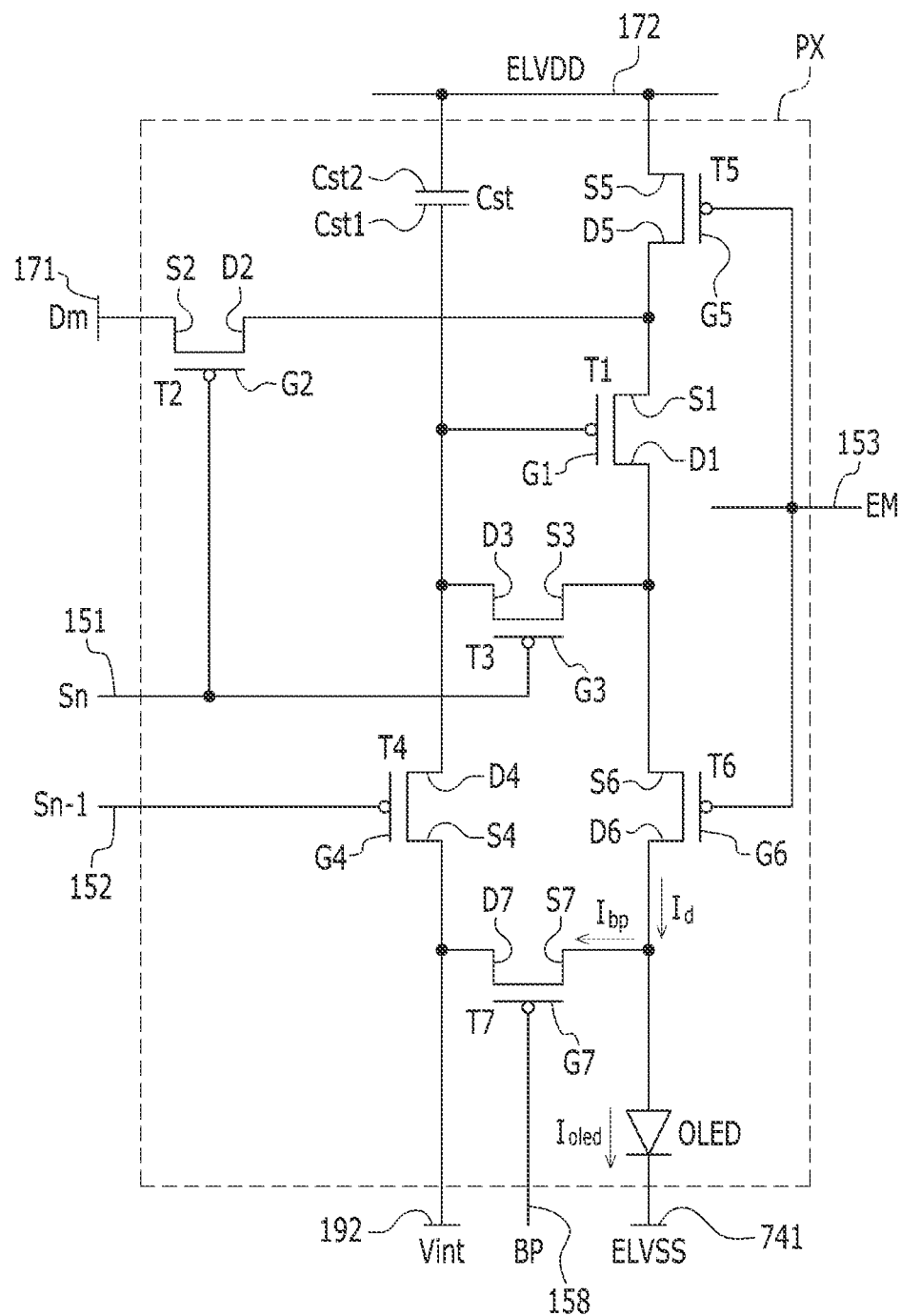
FIG. 1 is an equivalent circuit diagram of a pixel of an OLED display according to an exemplary embodiment.

The present disclosure will be described more fully hereinafter with reference to the accompanying drawings, in which exemplary embodiments of the disclosure are shown. As those skilled in the art would realize, the described embodiments can be modified in various different ways, all without departing from the spirit or scope of the present disclosure.

The drawings and description are to be regarded as illustrative in nature and not restrictive. Like reference numerals designate like elements throughout the specification.

Further, since sizes and thicknesses of constituent members shown in the accompanying drawings are arbitrarily given for better understanding and ease of description, the present disclosure is not limited thereto. In the drawings, the thickness of layers, films, panels, regions, etc., are exaggerated for clarity. In the drawings, for better understanding and ease of description, the thicknesses of some layers and areas are exaggerated.

In addition, unless explicitly described to the contrary, the word "comprise" and variations such as "comprises" or "comprising" will be understood to imply the inclusion of stated elements but not the exclusion of any other elements. Also, in an entire specification, it will be understood that when an element such as a layer, film, region, or substrate is referred to as being "on" another element, it can be directly on the other element or intervening elements can also be present. Throughout this specification, it is understood that the term "on" and similar terms are used generally and are not necessarily related to a gravitational reference.

Further, in the specification, the phrase "in a plan view" means when an object portion is viewed from above, and the phrase "in a cross-section" means when a cross-section taken by vertically cutting an object portion is viewed from the side.

In the accompanying drawings, an active matrix (AM) type of organic light-emitting diode (OLED) display is illustrated to have a 7Tr-2Cap structure in which seven transistors and two capacitors are provided for one pixel, but the present disclosure is not limited thereto. Thus, in the OLED display, each pixel can be provided with a plurality of transistors and at least one capacitor, and can be formed to have various structures by further forming additional wires or omitting existing wires. In this case, the pixel is a minimum unit for displaying an image, and the OLED display displays the image through the plurality of pixels. In this disclosure, the term "substantially" includes the meanings of completely, almost completely or to any significant degree under some applications and in accordance with those skilled in the art. The term "connected" can include an electrical connection.

The OLED display according to the exemplary embodiment of the present disclosure will now be described in detail with reference to accompanying drawings.

FIG. 1 is an equivalent circuit diagram of one pixel of an OLED display according to an exemplary embodiment of the present disclosure.

As shown in FIG. 1, the OLED display includes a plurality of signal lines 151, 152, 153, 158, 171, 172, and 192, and a plurality of pixels PX arranged in a matrix and connected to a plurality of signal lines.

One pixel PX includes a plurality of transistors T1, T2, T3, T4, T5, T6, and T7, a storage capacitor Cst, and an OLED OLD that are connected to the plurality of signal lines 151, 152, 153, 158, 171, 172, and 192.

The transistors T1, T2, T3, T4, T5, T6, and T7 include a driving transistor T1, a switching transistor T2, a compensation transistor T3, an initialization transistor T4, an operation control transistor T5, a light emission control transistor T6, and a bypass transistor T7.

The signal lines 151, 152, 153, 158, 171, 172, and 192 include a scan line 151 transferring a scan signal Sn, a previous scan line 152 transferring a previous scan signal Sn−1 to the initialization transistor T4, a light emission control line 153 transferring a light emission control signal EM to the operation control transistor T5 and the light emission control transistor T6, a bypass control line 158 transferring a bypass signal BP to the bypass transistor T7, a data line 171 crossing the scan line 151 and transferring a data signal Dm, a driving voltage line 172 transferring a driving voltage ELVDD and disposed to be substantially parallel with the data line 171, and an initialization voltage line 192 transferring an initialization voltage Vint initializing the driving transistor T1.

A gate electrode G1 of the driving transistor T1 is connected to one end Cst1 of the storage capacitor Cst, a source electrode S1 of the driving transistor T1 is connected to the driving voltage line 172 via the operation control transistor T5, and a drain electrode D1 of the driving transistor T1 is electrically connected to an anode of the OLED via the light emission control transistor T6. The driving transistor T1 receives the data signal Dm according to a switching operation of the switching transistor T2 to supply a driving current Id to the OLED.

A gate electrode G2 of the switching transistor T2 is connected to the scan line 151, a source electrode S2 of the switching transistor T2 is connected to the data line 171, and a drain electrode D2 of the switching transistor T2 is connected to the source electrode S1 of the driving transistor T1 and with the driving voltage line 172 via the operation control transistor T5. The switching transistor T2 is turned on according to the scan signal Sn received through the scan line 151 to perform a switching operation of transferring the data signal Dm transferred to the data line 171 to the source electrode of the driving transistor T1.

A gate electrode G3 of the compensation transistor T3 is directly connected to the scan line 151, a source electrode S3 of the compensation transistor T3 is connected to the drain electrode D1 of the driving transistor T1 and with an anode of the OLED via the light emission control transistor T6, and a drain electrode D3 of the compensation transistor T3 is connected to one end Cst1 of the storage capacitor Cst and the drain electrode D4 of the initialization transistor T4, and the gate electrode G1 of the driving transistor T1, together. The compensation transistor T3 is turned on according to the scan signal Sn received through the scan line 151 to connect the gate electrode G1 and the drain electrode D1 of the driving transistor T1 and diode-connect the driving transistor T1.

A gate electrode G4 of the initialization transistor T4 is connected to the previous scan line 152, a source electrode S4 of the initialization transistor T4 is connected to the initialization voltage line 192, and a drain electrode D4 of the initialization transistor T4 is connected to one end Cst1 of the storage capacitor Cst and the gate electrode G1 of the driving transistor T1 together through the drain electrode D3 of the compensation transistor T3. The initialization transistor T4 is turned on according to a previous scan signal Sn−1 received through the previous scan line 152 to transfer the initialization voltage Vint to the gate electrode G1 of the driving transistor T1 and then perform an initialization operation of initializing a voltage of the gate electrode G1 of the driving transistor T1.

A gate electrode G5 of the operation control transistor T5 is connected to the light emission control line 153, a source electrode S5 of the operation control transistor T5 is connected to the driving voltage line 172, and a drain electrode D5 of the operation control transistor T5 is connected to the source electrode S1 of the driving transistor T1 and the drain electrode S2 of the switching transistor T2.

A gate electrode G6 of the light emission control transistor T6 is connected to the light emission control line 153, the source electrode S6 of the first light emission control transistor T6 is connected to the drain electrode D1 of the driving transistor T1 and the source electrode S3 of the compensation transistor T3, and the drain electrode D6 of the first light emission control transistor T6 is electrically connected to the anode of the OLED. The operation control transistor T5 and the first light emission control transistor T6 are substantially simultaneously (or concurrently) turned on according to the light emission control signal EM transmitted to the light emission control line 153 such that the driving voltage ELVDD is compensated through the diode-connected driving transistor T1 and is transmitted to the OLED.

A gate electrode G7 of the thin film bypass transistor T7 is connected to the bypass control line 158, a source electrode S7 of the bypass thin film transistor T7 is connected to the drain electrode D6 of the light emission control thin film transistor T6 and the anode of the OLED together. A drain electrode D7 of the bypass thin film transistor T7 is connected to the initialization voltage line 192 and the source electrode S4 of the initialization thin film transistor T4 together. In this case, the previous scan line 152 is connected to the scan line 151 transmitting the scan signal Sn in the previous pixel (not shown), and the bypass control line 158 corresponds to the previous scan line 152 such that the bypass signal BP is the same as the previous scan signal S(n−1).

The other end Cst2 of the storage capacitor Cst is connected to the driving voltage line 172, and a cathode of the OLED is connected to a common voltage line 741 transferring a common voltage ELVSS.

A 7-transistor and 1-capacitor structure including the bypass transistor T7 is described in an exemplary embodiment of the present disclosure, however the present disclosure is not limited thereto, and the number of transistors and the number of capacitors can be variously changed.

Hereinafter, a detailed operation process of one pixel of the OLED display according to the exemplary embodiment of the present disclosure will be described in detail with reference to FIG. 2.

Figure 2:
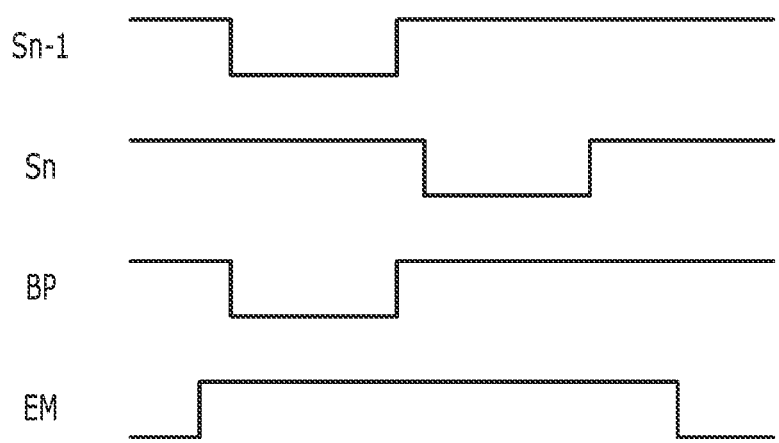
FIG. 2 is a timing diagram of a signal applied to a pixel of an OLED display according to an exemplary embodiment.

FIG. 2 is a timing diagram of signals applied to one pixel of an OLED display according to an exemplary embodiment of the present disclosure.

As shown in FIG. 2, first, for an initializing period, the previous scan signal S(n−1) having a low level is supplied through the previous scan line 152. Then, the initializing thin film transistor T4 is turned on in response to the previous scan signal S(n−1) having the low level, the initial voltage Vint is connected to the gate electrode G1 of the driving transistor T1 from the initialization voltage line 178 through the initializing thin film transistor T4, and then the driving thin film transistor T1 is initialized by the initialization voltage Vint.

Thereafter, for a data programming period, the scan signal Sn having a low level is supplied through the scan line 151. Then, the switching thin film transistor T2 and the compensating thin film transistor T3 are turned on in response to the scan signal Sn having the low level. At this time, the driving transistor T1 is diode-connected through the turned-on compensation transistor T3 and is biased in a forward direction.

Then, a compensation voltage Dm+Vth (Vth is a negative (−) value) reduced by a threshold voltage Vth of the driving thin film transistor T1 from a data signal Dm supplied from the data line 171 is applied to the gate electrode G1 of the driving thin film transistor T1. That is, the gate voltage Vg applied to the gate electrode G1 of the driving transistor T1 becomes the compensation voltage (Dm+Vth).

The driving voltage ELVDD and the compensation voltage (Dm+Vth) are applied to both terminals of the storage capacitor Cst, and a charge corresponding to a voltage difference between both terminals is stored in the storage capacitor Cst. Next, during the light emission period, the light emission control signal EM supplied from the light emission control line 153 is changed from the high level into the low level. Thus, the operation control transistor T5 and the light emission control transistor T6 are turned on by the light emission control signal EM of the low level during the light emission period.

Thus, a driving current Id is generated according to the voltage difference between the gate voltage of the gate electrode G1 of the driving transistor T1 and the driving voltage ELVDD, and the driving current Id is supplied to the OLED through the light emission control transistor T6. The gate-source voltage Vgs of the driving thin film transistor T1 is maintained as "(Dm+Vth)-ELVDD" by the storage capacitor Cst for the light emission period, and according to a current-voltage relationship of the driving thin film transistor T1, the driving current Id is proportional to the square "(Dm-ELVDD)2" of a value obtained by subtracting the threshold voltage from the source-gate voltage. Accordingly, the driving current Id is determined regardless of the threshold voltage Vth of the driving thin film transistor T1.

In this case, the bypass transistor T7 is transmitted with the bypass signal BP from the bypass control line 158 to be turned on. Accordingly, the driving current Id is partially discharged through the bypass transistor T7 as the bypass current Ibp. When a minimum current of the driving transistor T1 displaying the black image flows as the driving current, if the OLED is also emitted, the black image is not normally displayed. Accordingly, the bypass transistor T7 of the OLED display according to an exemplary embodiment of the present disclosure can disperse the portion of the minimum current of the driving transistor T1 as the bypass current Ibp through the other current path beside the current path of the OLED side. Here, the minimum current of the driving transistor T1 means the current in a condition that the driving transistor T1 is turned off since the gate-source voltage Vgs of the driving transistor T1 is less than the threshold voltage Vth. The minimum driving current (for example, a current of about 10 pA or less) under the condition in which the driving transistor T1 is turned off is transferred to the OLED to be expressed as an image with black luminance. When the minimum driving current expressing the black image flows, an influence on a bypass transfer of the bypass current Ibp is large, but when a large driving current expressing an image such as a normal image or a white image flows, there can be little influence on the bypass current Ibp. Accordingly, when the driving current displaying a black image flows, the light emission current Told of the OLED which is reduced by the current amount of the bypass current Ibp which flows out from the driving current Id through the bypass transistor T7 has a minimum current amount as a level which can exactly express the black image. Therefore, a black luminance image is exactly implemented by using the bypass transistor T7, thereby improving a contrast ratio. In FIG. 2, the bypass signal BP is the same as the previous scan signal S(n−1), but is not necessarily limited thereto.

Next, a structure in which a plurality of pixels of the OLED display shown in FIG. 1 and FIG. 2 are formed will be described with reference to FIG. 3.

Figure 3:
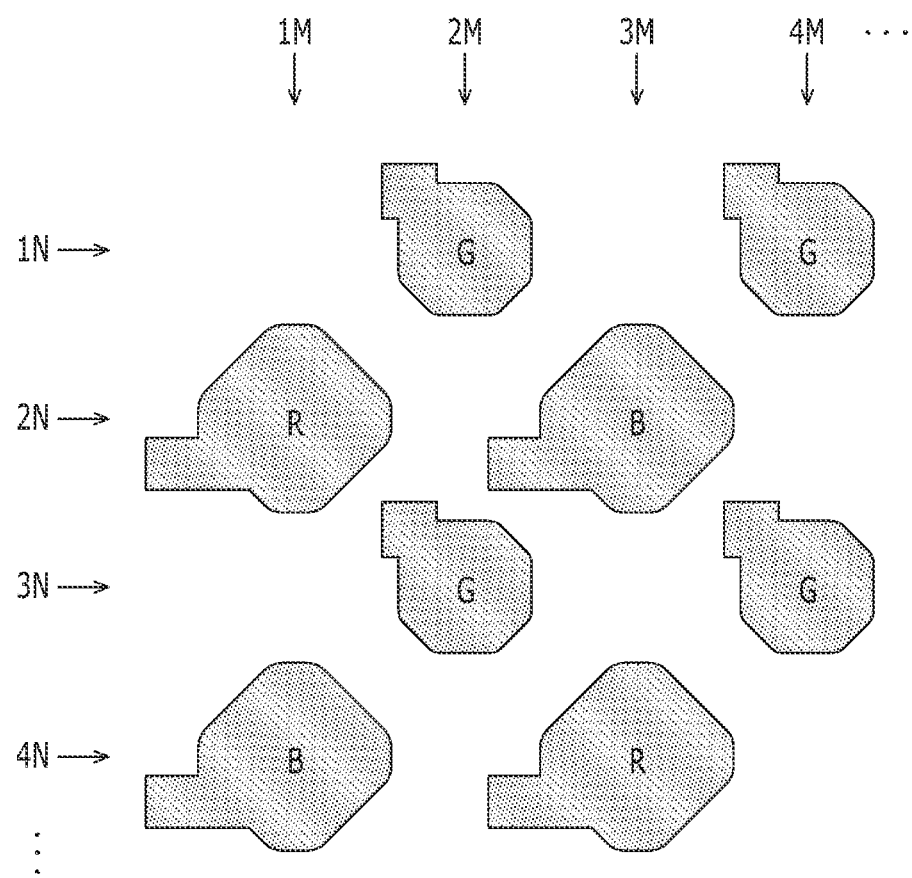
FIG. 3 is a schematic layout view of a plurality of pixels of an OLED display according to an exemplary embodiment of the present disclosure.

FIG. 3 is a schematic layout view of a plurality of pixels of an OLED display according to an exemplary embodiment of the present disclosure.

As shown in FIG. 3, a plurality of green pixels G corresponding to the second pixel are disposed with a predetermined interval to be separated in the first row 1N, a red pixel R corresponding to the first pixel and a blue pixel B corresponding to the third pixel are alternately disposed in the second row 2N adjacent thereto, a plurality of green pixels G are disposed to be separated with the predetermined interval in the adjacent third row 3N, and a blue pixel B and a red pixel R are alternately disposed in the fourth row 4N adjacent thereto. The arrangement of these pixels is repeated until the N-th row. In this case, the blue pixel B and the red pixel R are disposed to be larger than the green pixel G.

In this case, the green pixels G disposed in the first row 1N and the red pixels R and blue pixel B disposed in the second row 2N are disposed to mismatch. Accordingly, the red pixel R and the blue pixel B are alternately disposed in the first column 1M, the green pixels G are disposed with the predetermined interval to be separated in the second column 2M adjacent thereto, the blue pixel B and the red pixel R are alternately disposed in the third column 3M adjacent thereto, and the green pixels G are disposed with the predetermined interval to be separated in the fourth column 4M adjacent thereto. The arrangement of these pixels is repeated until the M-th column.

The aforementioned pixel disposition structure is referred to as a pentile matrix, and high definition with a small number of pixels can be implemented by adopting rendering driving of sharing adjacent pixels to express colors.

Now, a detailed structure of the OLED display according to an exemplary embodiment of the present disclosure applied with this pixel arrangement shown in FIG. 3 will be described with reference to FIG. 4, FIG. 5, FIG. 6, FIG. 7, FIG. 8, FIG. 9, FIG. 10, and FIG. 11.

Figure 4:
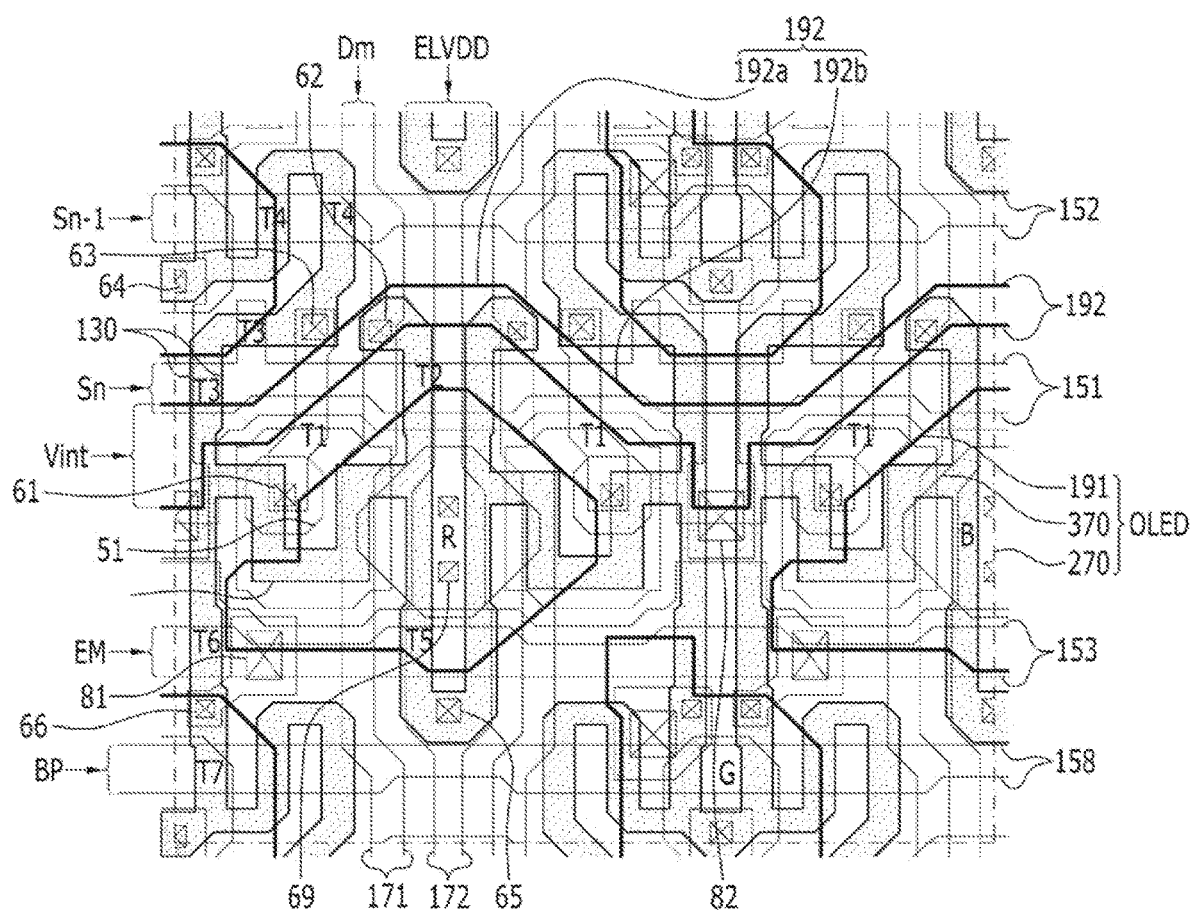
FIG. 4 is a schematic layout view of a transistor and a capacitor forming a red pixel, a green pixel, and a blue pixel of an OLED display according to an exemplary embodiment.
Figure 5:
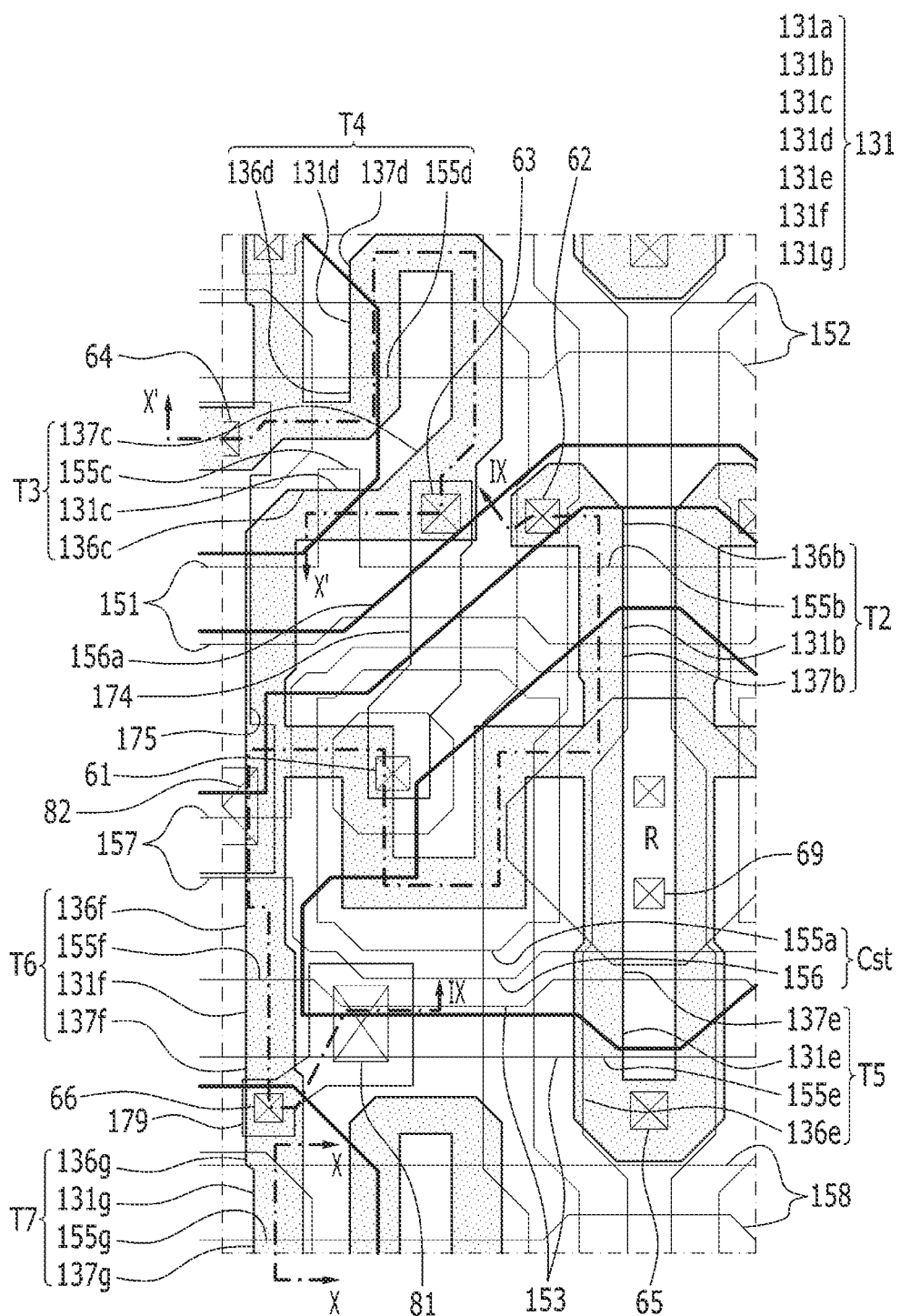
FIG. 5 is a detailed layout view of one pixel of FIG. 4.
Figure 6:
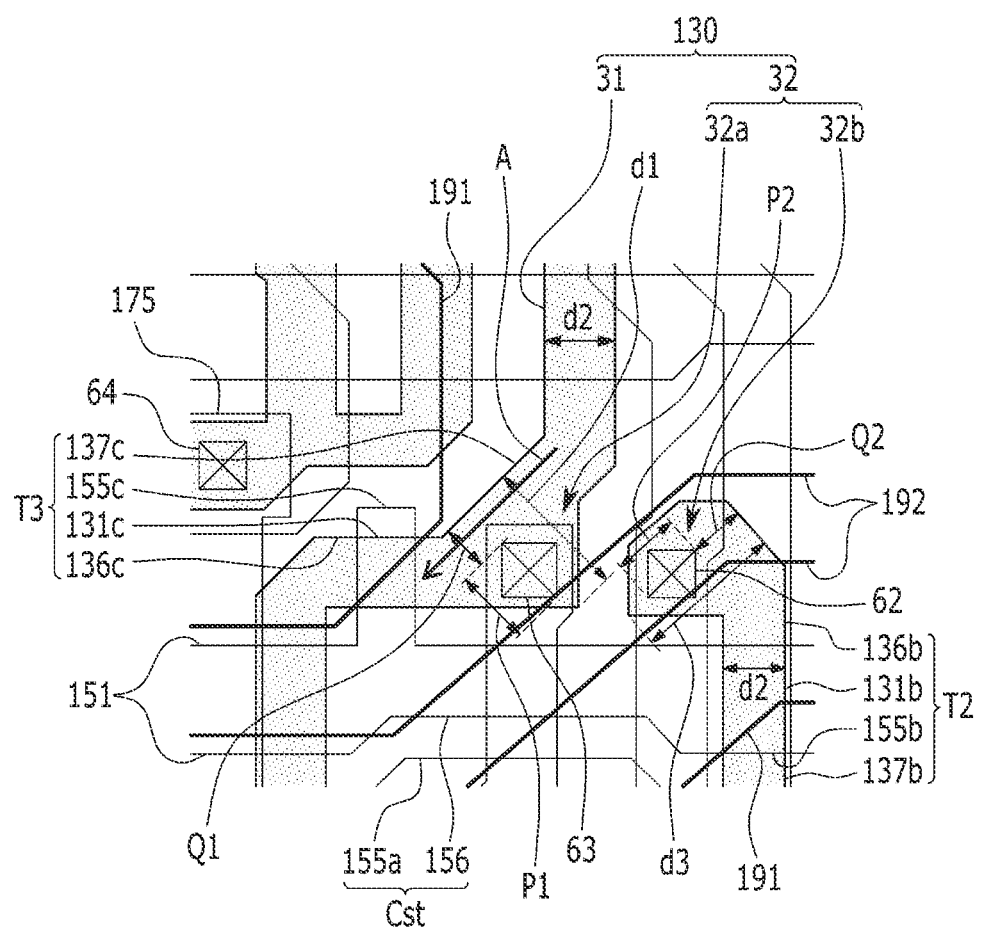
FIG. 6 is an enlarged layout view of a switching transistor T2 and a compensation transistor T3 in FIG. 4.
Figure 7:
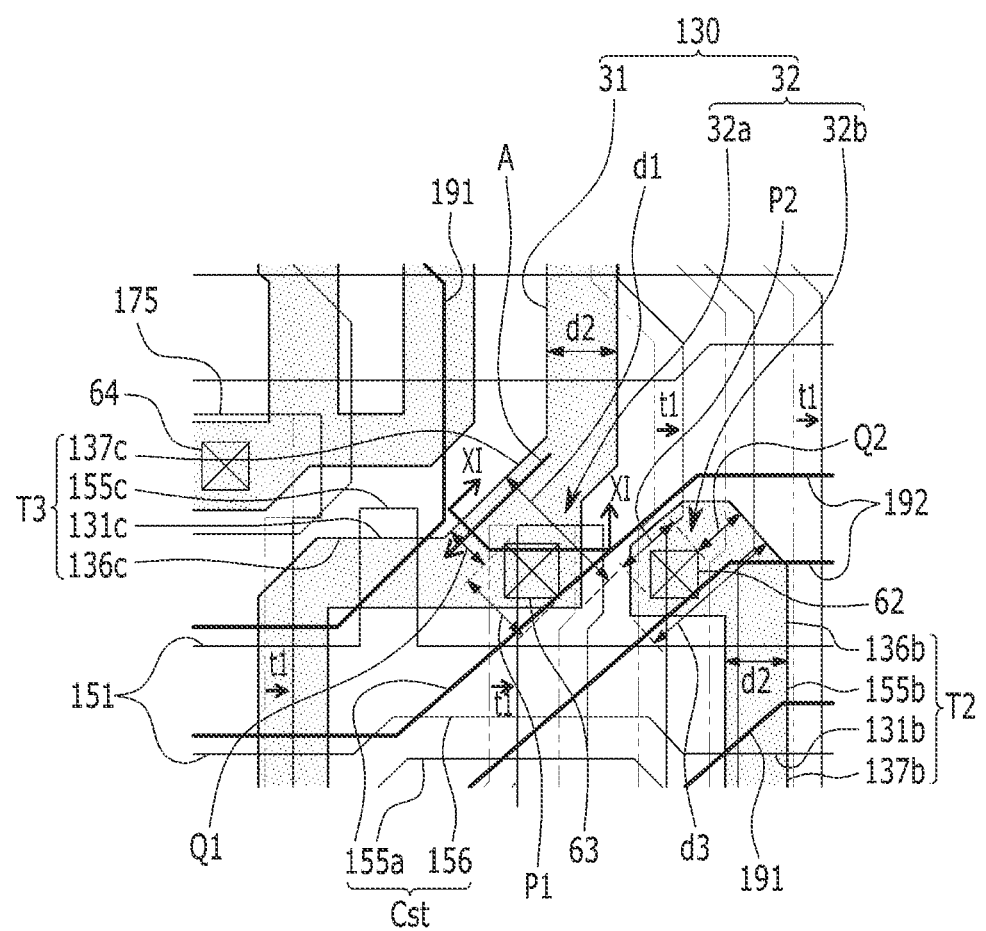
FIG. 7 is an enlarged layout view of a switching transistor T2 and a compensation transistor T3 in FIG. 6 when an interlayer alignment error is generated such that a data metal line is shifted to a right side.
Figure 8:
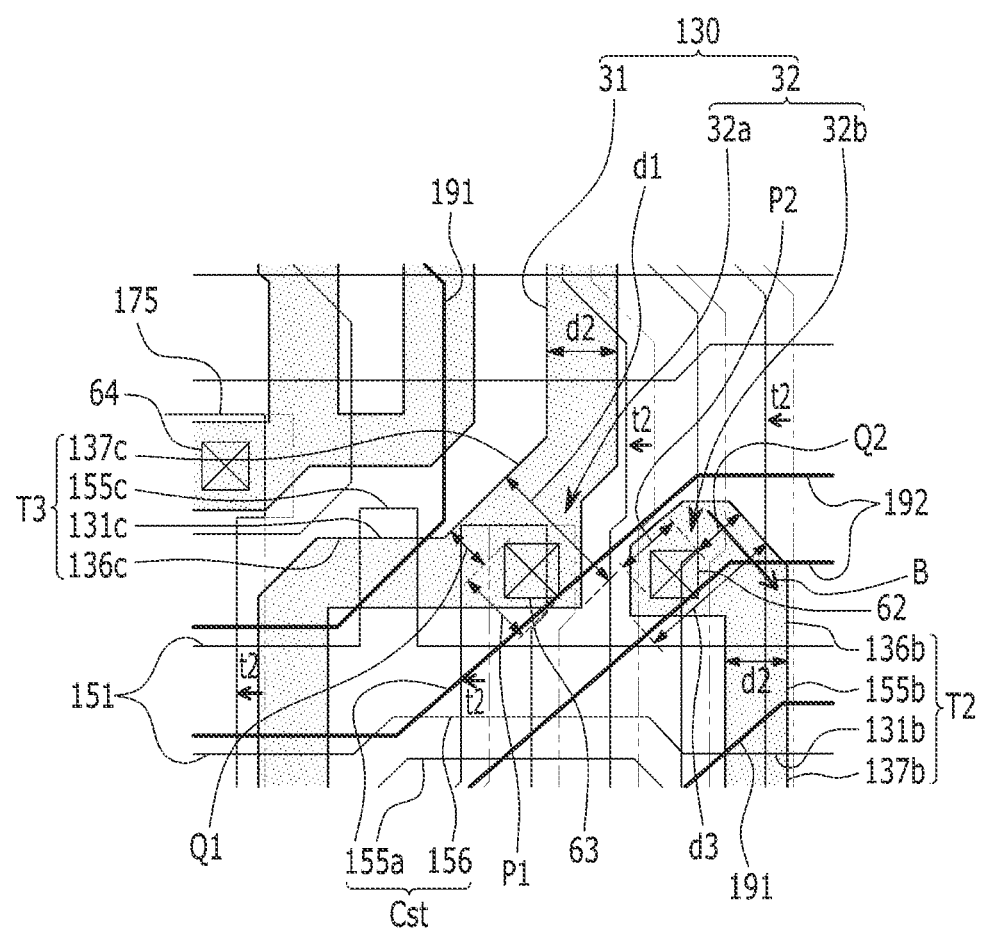
FIG. 8 is an enlarged layout view of a switching transistor T2 and a compensation transistor T3 in FIG. 6 when an interlayer alignment error is generated such that a data metal line is shifted to a left side.
Figure 9:
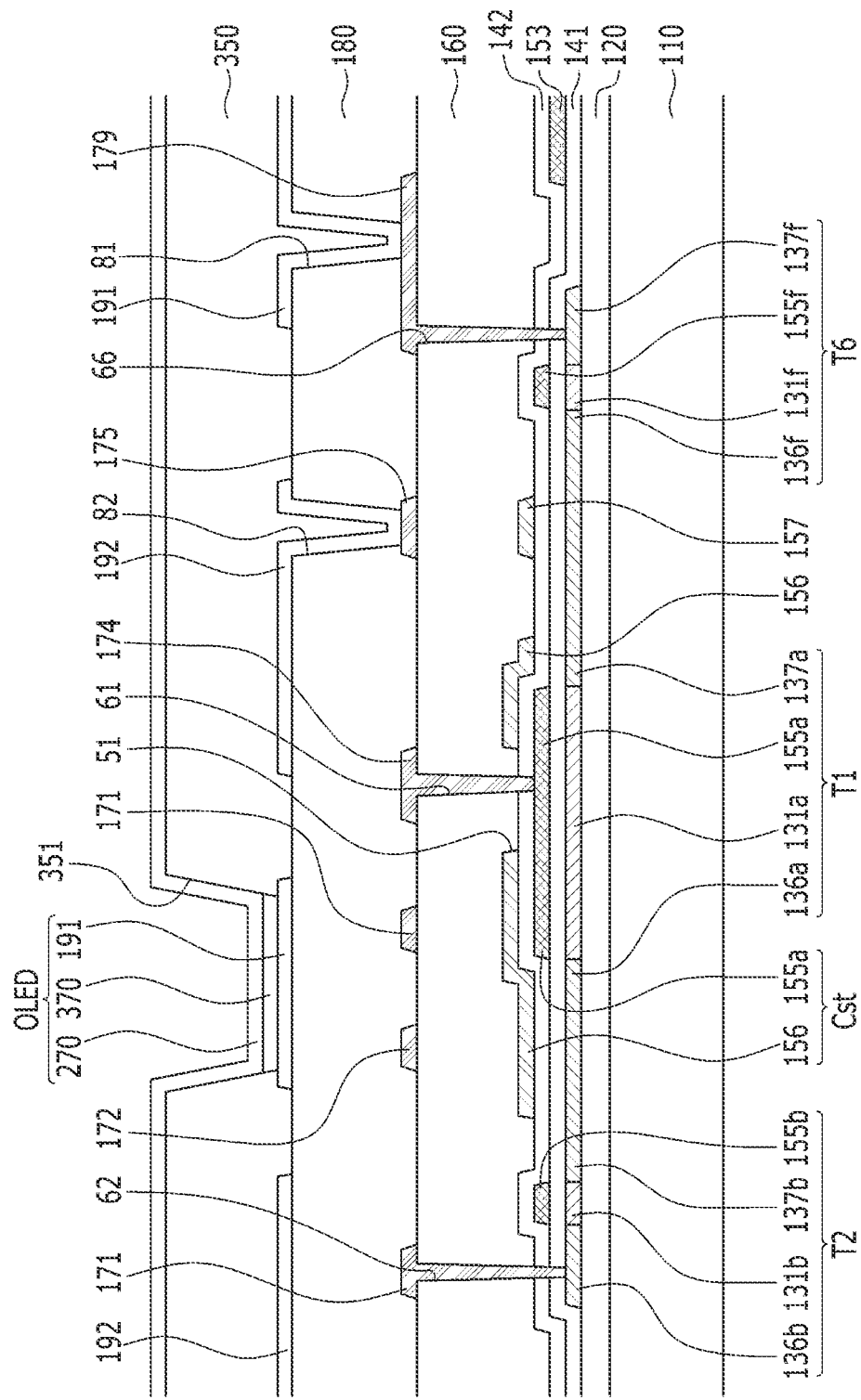
FIG. 9 is a cross-sectional view of an OLED display of FIG. 5 taken along a line IX-IX.
Figure 10:
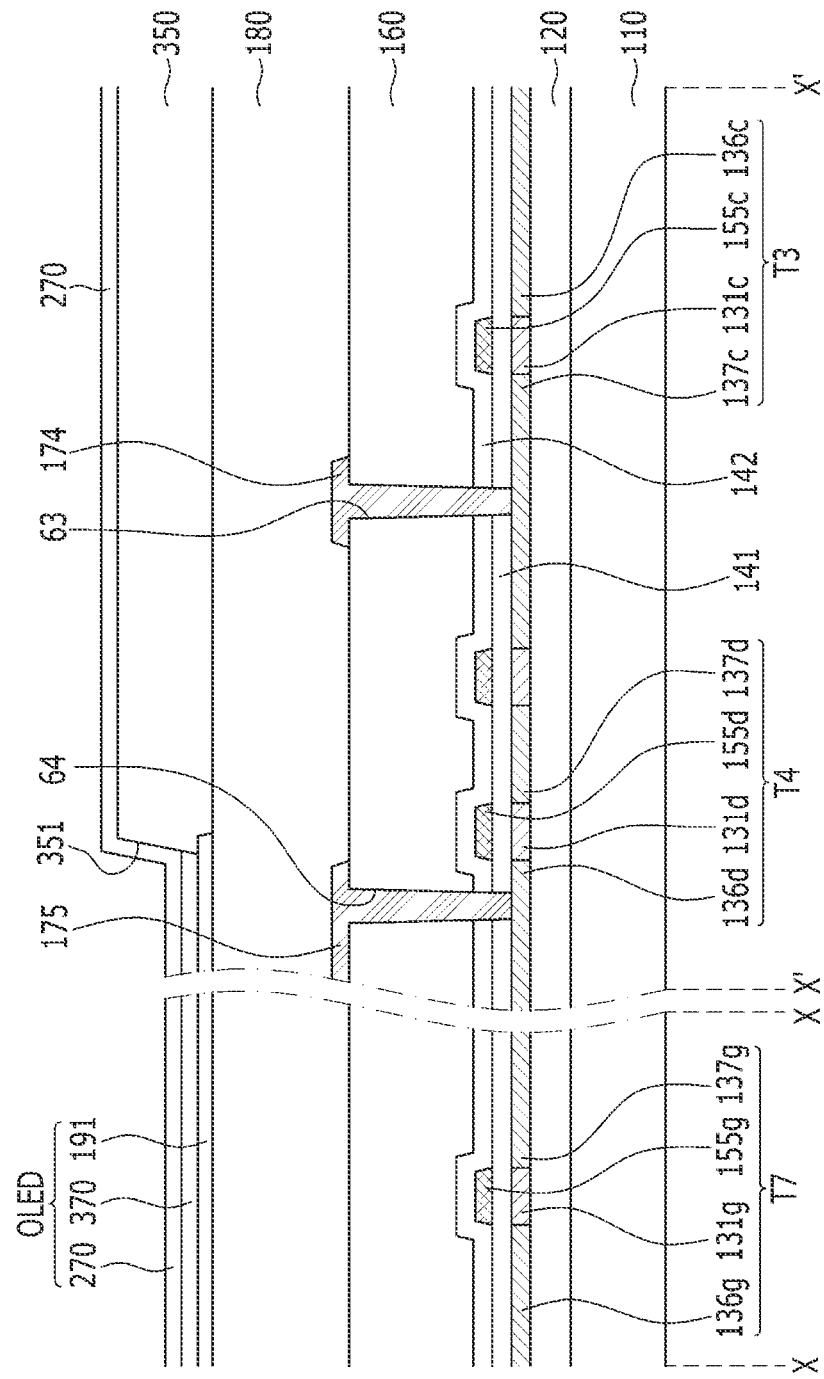
FIG. 10 is a cross-sectional view of an OLED display of FIG. 5 taken along lines X-X and X'-X'.
Figure 11:
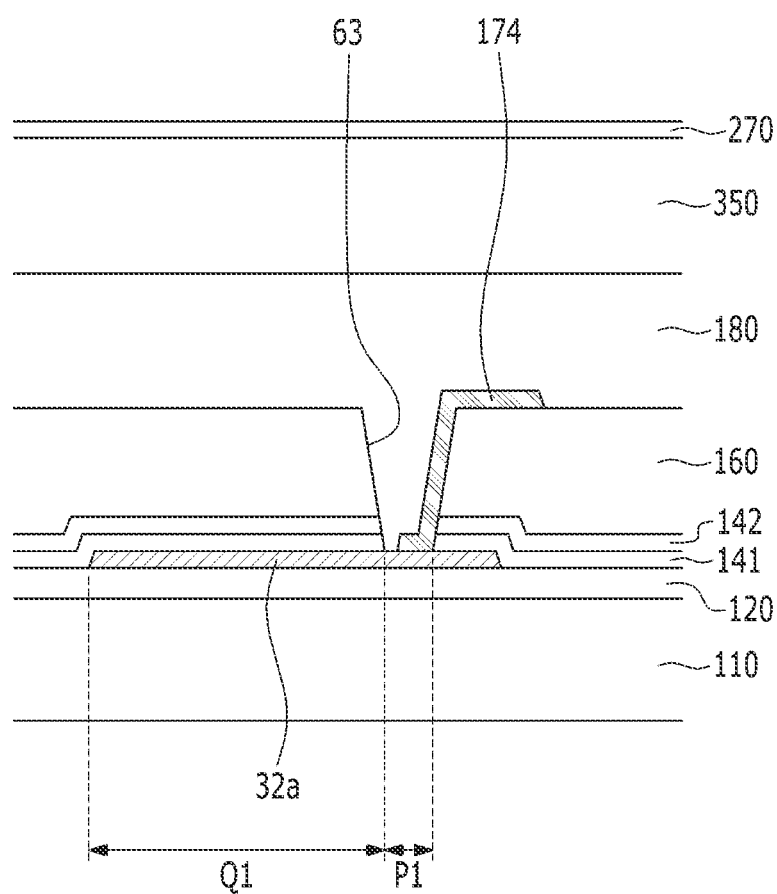
FIG. 11 is a cross-sectional view of an OLED display of FIG. 7 taken along a line XI-XI.

FIG. 4 is a schematic layout view of a transistor and a capacitor forming a red pixel, a green pixel, and a blue pixel of an OLED display according to an exemplary embodiment of the present disclosure. FIG. 5 is a detailed layout view of one pixel of FIG. 4. FIG. 6 is an enlarged layout view of a switching transistor T2 and a compensation transistor T3 in FIG. 4. FIG. 7 is an enlarged layout view of a switching transistor T2 and a compensation transistor T3 in FIG. 6 when an interlayer alignment error is generated such that a data metal line is shifted to the right side. FIG. 8 is an enlarged layout view of a switching transistor T2 and a compensation transistor T3 in FIG. 6 when an interlayer alignment error is generated such that a data metal line is shifted to the left side. FIG. 9 is a cross-sectional view of an OLED display of FIG. 5 taken along a line IX-IX. FIG. 10 is a cross-sectional view of an OLED display of FIG. 5 taken along lines X-X and X'-X'. FIG. 11 is a cross-sectional view of an OLED display of FIG. 7 taken along a line XI-XI.

Hereinafter, a detailed planar structure of the OLED display according to the exemplary embodiment of the present disclosure will be first described in detail with reference to FIG. 4, FIG. 5, FIG. 6, FIG. 7, and FIG. 8, and a detailed cross-sectional structure will be described in detail with reference to FIG. 9, FIG. 10, and FIG. 11.

As shown in FIG. 4 and FIG. 5, the OLED display according to an exemplary embodiment of the present disclosure includes a gate metal line (151, 152, 153, and 158) including a scan line 151, a previous scan line 152, a light emission control line 153, and a bypass control line 158 respectively applying a scan signal Sn, a previous scan signal S(n−1), a light emission control signal EM, and a bypass signal BP and disposed in the row direction. In the present exemplary embodiment, the bypass control line 158 is substantially the same as the previous scan line 152.

Also, a data line 171 and a driving voltage line 172 crossing the scan line 151, the previous scan line 152, the emission control line 153, and the bypass control line 158 and respectively applying a data signal Dm and a driving voltage ELVDD to the pixel PX are further included. The initialization voltage Vint is transmitted from the initialization voltage line 192 to the compensation transistor T3 through the initialization transistor T4. The initialization voltage line 192 is disposed while alternatively having a straight portion 192 a and an oblique portion 192 b. The straight portion 192 a is disposed to be parallel to the scan line 121, and the oblique portion 192 b extends at a predetermined angle with the straight portion 192 a.

Also, the pixel PX is provided with the driving transistor T1, the switching transistor T2, the compensation transistor T3, the initialization transistor T4, the operation control transistor T5, the light emission control transistor T6, the bypass transistor T7, the storage capacitor Cst, and the OLED. The pixel PX shown in FIG. 4 and FIG. 5 can correspond to the red pixel R, the green pixel G, and the blue pixel B forming the pentile matrix structure.

The OLED includes a pixel electrode 191, an organic emission layer 370, and a common electrode 270. In this case, the compensation transistor T3 and the initialization transistor T4 are configured of a transistor having a dual gate structure to cut off a leakage current.

Each channel of the driving transistor T1, the switching transistor T2, the compensation transistor T3, the initialization transistor T4, the operation control transistor T5, the light emission control transistor T6, and the bypass transistor T7 is disposed inside one connected semiconductor member (or semiconductor layer) 130 which can be bent in various shapes. The semiconductor member 130 can be formed of polysilicon or an oxide semiconductor. The oxide semiconductor can include one of oxides based on titanium (Ti), hafnium (Hf), zirconium (Zr), aluminum (Al), tantalum (Ta), germanium (Ge), zinc (Zn), gallium (Ga), tin (Sn), or indium (In), or zinc oxide (ZnO), indium-gallium-zinc oxide (InGaZnO₄), indium zinc oxide (In—Zn—O), zinc-tin oxide (Zn—Sn—O), indium gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In-Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium gallium oxide (In—Ge—Ga—O), titanium-indium-zinc oxide (Ti—In—Zn—O), and hafnium-indium-zinc oxide (Hf—In—Zn—O) which are complex oxides thereof. In the case where the semiconductor member 130 is formed of the oxide semiconductor material, a separate passivation layer for protecting the oxide semiconductor material which is vulnerable to an external environment such as a high temperature can be added.

The semiconductor member 130 includes a channel which is doped with an N-type impurity or a P-type impurity, and a source doping part and a drain doping part which are disposed at respective sides of the channel and doped with an opposite-type doping impurity to the doping impurity doped on the channel. In the exemplary embodiment, the source doping part and the drain doping part correspond to the source electrode and the drain electrode, respectively. The source electrode and the drain electrode disposed in the semiconductor member 130 can be formed by doping only the corresponding regions. Further, in the semiconductor member 130, a region between source electrodes and drain electrodes of different transistors is doped and thus the source electrode and the drain electrode can be electrically connected to each other.

As illustrated in FIG. 5, the channel 131 includes a driving channel 131 *a* disposed in the drive transistor T1, a switching channel 131 *b* disposed in the switching transistor T2, a compensation channel 131 *c* disposed in the compensation transistor T3, an initialization channel 131 *d* disposed in the initialization transistor T4, an operation control channel 131 *e* disposed in the operation control transistor T5, a light emission control channel 131 *f* disposed in the light emission control transistor T6, and a bypass channel 131 *g* disposed in the bypass transistor T7.

The driving transistor T1 includes the driving channel 131 *a*, a driving gate electrode 155 *a*, a driving source electrode 136 *a*, and a driving drain electrode 137 *a*. The driving channel 131 *a* can be curved, and can have a meandering shape or a zigzag shape. As such, by forming the curved driving channel 131 *a*, the driving channel 131 *a* can be disposed to be elongated in a narrow space. Accordingly, a driving range of the driving gate-source voltage Vgs between the driving gate electrode 155 *a* and the driving source electrode 136 *a* is increased by the elongated driving channel 131 *a*. Since the driving range of the gate voltage is increased, a grayscale of light emitted from the OLED can be finely controlled by changing the magnitude of the gate voltage, and as a result, the resolution of the OLED display device can be enhanced and display quality can be improved. Various examples such as 'reverse S', 'S', 'M', and 'W' can be implemented by variously modifying the shape of the driving channel 131 *a*.

The driving gate electrode 155 *a* overlaps the driving channel 131 *a*. The driving source electrode 136 *a* and the driving drain electrode 137 *a* are disposed at respective sides of the driving channel 131 *a* to be close. The driving gate electrode 155 *a* is connected to a driving connecting member (or driving connector) 174 through a contact hole 61. The driving gate electrode 155 *a* corresponds to the gate metal line, and the driving connecting member 174 corresponds to the data metal line.

The switching transistor T2 includes the switching channel 131 *b*, a switching gate electrode 155 *b*, a switching source electrode 136 *b*, and a switching drain electrode 137 *b*. The switching gate electrode 155 *b* which is part of the portion extending downward from the scan line 151 overlaps the switching channel 131 *b*. The switching source electrode 136 *b* and the switching drain electrode 137 *b* are disposed at respective sides of the switching channel 131 *b*, while being adjacent to each other. The switching source electrode 136 *b* is connected to the data line 171 through a switching contact hole 62.

The compensation transistor T3 includes the compensation channel 131 *c*, a compensation gate electrode 155 *c*, a compensation source electrode 136 *c*, and a compensation drain electrode 137 *c*. The compensation gate electrode 155 *c* that is a part of the scan line 151 is formed as two to prevent a leakage current, and overlaps the compensation channel 131 *c*. The compensation source electrode 136 *c* and the compensation drain electrode 137 *c* are disposed to be adjacent to respective sides of the compensation channel 131 *c*. The compensation drain electrode 137 *c* is connected to the driving connecting member 174 through a contact hole 63.

The initialization transistor T4 includes the initialization channel 131 *d*, an initialization gate electrode 155 *d*, an initialization source electrode 136 *d*, and an initialization drain electrode 137 *d*. The initialization gate electrode 155 *d* that is a part of the previous scan line 152 is formed as two to prevent the leakage current, and overlaps the initialization channel 131 *d*. The initialization source electrode 136 *d* and the initialization drain electrode 137 *d* are disposed to be adjacent to respective sides of the initialization channel 131 *d*. The initialization source electrode 136 *d* is connected to an initialization connecting member 175 through a contact hole 64.

The operation control transistor T5 includes the operation control channel 131 *e*, an operation control gate electrode 155 *e*, an operation control source electrode 136 *e*, and an operation control drain electrode 137 *e*. The operation control gate electrode 155 *e* that is a part of the light emission control line 153 overlaps the operation control channel 131 e, and the operation control source electrode 136 e and the operation control drain electrode 137 e are disposed to be adjacent to respective sides of the operation control channel 131 e. The operation control source electrode 136 e is connected to a part that extends from the driving voltage line 172 through a contact hole 65.

The light emission control transistor T6 includes the light emission control channel 131 f, a light emission control gate electrode 155 f, a light emission control source electrode 136 f, and a light emission control drain electrode 137 f. The light emission control gate electrode 155 f that is a part of the light emission control line 153 overlaps the light emission control channel 131 f. The light emission control source electrode 136 f and the light emission control drain electrode 137 f are disposed to be adjacent to respective sides of the light emission control channel 131 f. The light emission control drain electrode 137 f is connected to a pixel connecting member 179 through a contact hole 66.

The bypass transistor T7 includes the bypass channel 131 g, a bypass gate electrode 155 g, a bypass source electrode 136 g, and a bypass drain electrode 137 g. The bypass gate electrode 155 g that is a part of the bypass control line 158 overlaps the bypass channel 131 g, and the bypass source electrode 136 g and the bypass drain electrode 137 g are disposed to be adjacent to respective sides of the bypass channel 131 g.

The bypass source electrode 136 g is connected directly to the light emission control drain electrode 137 f, and the bypass drain electrode 137 g is connected directly to the initialization source electrode 136 d.

One end of the driving channel 131 a of the driving transistor T1 is connected to the switching drain electrode 137 b and the operation control drain electrode 137 e. The other end of the driving channel 131 a is connected to the compensation source electrode 136 c and the light emission control source electrode 136 f.

As shown in FIG. 6, the semiconductor member 130 includes a normal semiconductor part (or narrow semiconductor layer) 31 having a first width d2, and an expansion semiconductor part (or expansion semiconductor layer) 32 having a second width d1 greater than the first width d2. The narrow semiconductor part 31 corresponds to the channel 131, and most of the source electrode and the drain electrode.

The expansion semiconductor part 32 includes a first expansion semiconductor part 32 a connecting the compensation drain electrode 137 c and the initialization drain electrode 137 d to each other, and a second expansion semiconductor part 32 b overlapping the data line 171.

A compensation contact hole 63 is positioned in the first expansion semiconductor part 32 a on the plane, and a switching contact hole 62 is positioned in the second expansion semiconductor part 32 b. The compensation contact hole 63 is disposed at the position where the first expansion semiconductor part 32 a and the driving connecting member 174 cross each other on the plane, and the switching contact hole 62 is disposed at the position where the second expansion semiconductor part 32 b and the data line 171 overlap each other on the plane.

A width d1 of the first expansion semiconductor part 32 a can be greater than a width d2 of the narrow semiconductor part 31. Also, the edge of the first expansion semiconductor part 32 a encloses the edge of the compensation contact hole 63. That is, the first expansion semiconductor part 32 a includes a first contact semiconductor region P1 overlapping the compensation contact hole 63 and a first non-contact semiconductor region Q1 that does not overlap the compensation contact hole 63. The edge of the first expansion semiconductor part 32 a and the edge of the compensation contact hole 63 are separated from each other in the first non-contact semiconductor region Q1. The first non-contact semiconductor region Q1 is positioned on a shortest path A connecting the compensation drain electrode 137 c and the initialization drain electrode 137 d to each other. The shortest path A passes in front of the compensation contact hole 63. Accordingly, the current movement path can be sufficiently obtained through the first non-contact semiconductor region Q1 disposed in the first expansion semiconductor part 32 a.

The width d3 of the second expansion semiconductor part 32 b can be greater than the width d2 of the narrow semiconductor part. That is, the second expansion semiconductor part 32 b includes a second contact semiconductor region P2 overlapping the switching contact hole 62 and a second non-contact semiconductor region Q2 that does not overlap the switching contact hole 62. The edge of the second expansion semiconductor part 32 b and the edge of the switching contact hole 62 are separated from each other in the second non-contact semiconductor region Q2. Accordingly, the current movement path can be sufficiently obtained through the second non-contact semiconductor region Q2 disposed in the second expansion semiconductor part 32 b.

FIG. 7 shows the enlarged layout view of the switching transistor T2 and the compensation transistor T3 when the interlayer alignment error is generated such that the data metal line is moved to the right side in FIG. 6.

As shown in FIG. 7, the interlayer alignment error can be easily generated during the manufacturing process of a high resolution structure. When the interlayer alignment error is generated, the driving connecting member 174 and the data line 171 are shifted by a predetermined interval t1 to the right side with respect to a position to be disposed on an original design. Accordingly, one end of the driving connecting member 174 does not completely cover the compensation contact hole 63 such that a portion of the compensation contact hole 63 is exposed outside. An etchant penetrates through the exposed compensation contact hole 63 such that the portion of the first expansion semiconductor part 32 a is damaged. However, even if the first contact semiconductor region P1 of the first expansion semiconductor part 32 a is damaged, the first non-contact semiconductor region Q1 is not damaged such that the current movement path A between the compensation drain electrode 137 c and the initialization drain electrode 137 d is obtained. The current movement path corresponds to the shortest path A.

As described above, the first non-contact semiconductor region Q1 passing in front of the compensation contact hole 63 and corresponding to the shortest path is disposed in the first expansion semiconductor part 32 a disposed at the position corresponding to the compensation contact hole 63, thereby sufficiently obtaining the current movement path in the first expansion semiconductor part 32 a. Accordingly, the opening of the first expansion semiconductor part 32 a that can be generated by the penetration of the etchant for the data metal line through the compensation contact hole 63 due to the interlayer alignment error can be prevented. Accordingly, the non-uniform lighting between the adjacent pixels can be prevented in a high resolution structure.

FIG. 8 shows the enlarged layout view of the switching transistor T2 and the compensation transistor T3 when the interlayer alignment error is generated such that the data metal line is moved to the left side in FIG. 6.

As shown in FIG. 8, when the interlayer alignment error is generated in the manufacturing process of a high resolution structure, the driving connecting member 174 and the data line 171 are shifted by a predetermined interval t2 to the left side with respect to a position to be disposed on an original design. Accordingly, the data line 171 does not completely cover the switching contact hole 62 such that a portion of the switching contact hole 62 is exposed outside. The etchant penetrates through the exposed switching contact hole 62 such that a portion of the second expansion semiconductor part 32 b is damaged. However, even if the second contact semiconductor region P2 of the second expansion semiconductor part 32 b is damaged by the etchant, the second non-contact semiconductor region Q2 is not damaged such that the current movement path B between the data line 171 and the switching source electrode 136 b is obtained.

As described above, the width d3 of the second expansion semiconductor part 32 b disposed at the position corresponding to the switching contact hole 62 is greater than the width d2 of the narrow semiconductor part, thereby sufficiently obtaining the current movement path in the second expansion semiconductor part 32 b. Accordingly, the opening of the second expansion semiconductor part 32 b that can be generated by the penetration of the etchant for the data metal line through the switching contact hole 62 due to the interlayer alignment error can be prevented. Accordingly, in the high resolution structure, the non-uniform lighting between the adjacent pixels can be prevented.

On the other hand, the capacitor Cst includes the first storage electrode 155 a and a second storage electrode 156, with a second gate insulating layer 142 disposed therebetween. The first storage electrode 155 a corresponds to the driving gate electrode 155 a. And the second storage electrode 156 is a portion extending from the storage line 157 and occupies a wider area than that of the driving gate electrode 155 a and completely covers the driving gate electrode 155 a.

Here, the second gate insulating layer 142 is a dielectric material, and storage capacitance is determined by a charge charged in the storage capacitor Cst and a voltage between both electrodes 155 a and 156. As such, the driving gate electrode 155 a is used as the first storage electrode 155 a, and thus a space in which the storage capacitor can be disposed can be secured in a space that is narrowed due to the driving channel 131 a occupying a large area within the pixel.

The first storage electrode 155 a which is the driving gate electrode 155 a is connected to one end of the driving connecting member 174 through the driving contact hole 61 and a storage opening 51. The storage opening 51 is an opening which is disposed in the second storage electrode 156. Accordingly, the driving contact hole 61 to connect one end of the driving connecting member 174 and the driving gate electrode 155 a is disposed inside the storage opening 156. The driving connecting member 174 is disposed on the same layer as the data line 171 to be substantially parallel therewith. And the other end of the driving connecting member 174 is connected to the compensation drain electrode 137 c of the compensation transistor T3 and the initialization drain electrode 137 d of the initialization transistor T4 through the compensation contact hole 63. Accordingly, the driving connecting member 174 connects the driving gate electrode 155 a and the compensation drain electrode 137 c of the compensation transistor T3 and the initialization drain electrode 137 d of the initialization transistor T4 to each other.

The second storage electrode 156 is connected to the driving voltage line 172 through a contact hole 69.

Accordingly, the storage capacitor Cst stores storage capacitance corresponding to a difference between the driving voltage ELVDD transmitted to the second storage electrode 156 through the driving voltage line 172 and the gate voltage Vg of the driving gate electrode 155 a.

The pixel connecting member 179 is connected to the pixel electrode 191 through a contact hole 81. And the initialization connecting member 175 is connected to the initialization voltage line 192 through a contact hole 82.

Hereinafter, the cross-sectional structures of the OLED display device according to an exemplary embodiment of the present disclosure will be described in detail according to a stacking order with reference to FIG. 9, FIG. 10, and FIG. 11.

In this case, since the stacked structures of the operation control transistor T5 is mostly the same as that of the light emission control transistor T6, a detailed description thereof will be omitted.

A buffer layer 120 can be disposed on an insulating substrate 110. The insulating substrate 110 can be formed of an insulating material such as glass, crystal, ceramic, or plastic. The buffer layer 120 blocks impurities from the insulating substrate 110 during a crystallization process for forming a polycrystalline semiconductor to serve to improve characteristics of the polycrystalline semiconductor and reduce stress applied to the insulating substrate 110.

The semiconductor member 130 is disposed on the buffer layer 120. The semiconductor member 130 includes the channel 131 including the driving channel 131 a, the switching channel 131 b, the compensation channel 131 c, the initialization channel 131 d, the operation control channel 131 e, the light emission control channel 131 f, and the bypass channel 131 g. The driving source electrode 136 a and the driving drain electrode 137 a are disposed on respective sides of the driving channel 131 a in the semiconductor member 130. The switching source electrode 136 b and the switching drain electrode 137 b are disposed on respective sides of the switching channel 131 b. The compensation source electrode 136 c and the compensation drain electrode 137 c are disposed at both sides of the compensation channel 131 c. The initialization source electrode 136 d and the initialization drain electrode 137 d are disposed at both sides of the initialization channel 131 d. The operation control source electrode 136 e and the operation control drain electrode 137 e are disposed at both sides of the operation control channel 131 e, and the emission control source electrode 136 f and the emission control drain electrode 137 f are disposed at both sides of the emission control channel 131 f. The bypass source electrode 136 g and the bypass drain electrode 137 g are disposed at respective sides of the bypass channel 131 g.

The semiconductor member 130 includes the narrow semiconductor part 31 having the first width d2 and the expansion semiconductor part 32 having the second width d1 greater than the first width d2. The narrow semiconductor part 31 corresponds to the channel 131 and most of the source electrode and the drain electrode. The expansion semiconductor part 32 includes the first expansion semiconductor part 32 a, connecting the compensation drain electrode 137 c and the initialization drain electrode 137 d, and the second expansion semiconductor part 32 b overlapping the data line 171. The width d1 of the first expansion semiconductor part 32 a can be greater than the width d2 of the narrow semiconductor part.

A first gate insulating layer 141 covering the semiconductor member 130 is disposed thereon. A first gate metal line (151, 152, 153, 158, and 155 a) including the switching gate electrode 155 b, the scan line 151 including the compensation gate electrode 155 c, the previous scan line 152 including the initialization gate electrode 155 d, the light emission control line 153 including the operation control gate electrode 155 e and the light emission control gate electrode 155 f, the bypass control line 158 including the bypass gate electrode 155 g, and the driving gate electrode (the first storage electrode) 155 a are disposed on the first gate insulating layer 141.

The second gate insulating layer 142 covering the first gate metal line (151, 152, 153, 158, and 155 a) and the first gate insulating layer 141 is disposed thereon. The first gate insulating layer 141 and the second gate insulating layer 142 can be formed of a silicon nitride (SiNx) or a silicon oxide (SiOx).

On the second gate insulating layer 142, a second gate metal line (157 and 156) including a storage line 157 parallel to the scan line 151 and the storage electrode 156 as an expansion of the storage line 157 is disposed.

The second storage electrode 156 is wider than the first storage electrode 155 a functioning as the driving gate electrode such that the second storage electrode 156 completely covers the driving gate electrode 155 a.

A gate metal line (151, 152, 153, 155 a, 156, and 157) including the first gate metal line (151, 152, 153, 155 a) and the second gate metal line (156 and 157) can be formed as a multilayer in which metal layers formed of any of copper (Cu), a copper alloy, aluminum (Al), an aluminum alloy, molybdenum (Mo), and a molybdenum alloy are stacked.

An interlayer insulating layer 160 is disposed on the second gate insulating layer 142 and the second gate wire (157 and 156). The interlayer insulating layer 160 can be formed of a silicon nitride (SiNx) or a silicon oxide (SiOx).

The interlayer insulating layer 160 has contact holes 61, 62, 63, 64, 65, 66, and 69. A data metal line (171, 172, 174, 175, and 179) including a data line 171, a driving voltage line 172, a driving connecting member 174, an initialization connecting member 175, and a pixel connecting member 179 are disposed on the interlayer insulating layer 160. The data metal line (171, 172, 174, 175, and 179) can be formed as a multilayer in which metal layers including any of copper (Cu), a copper alloy, aluminum (Al), an aluminum alloy, molybdenum (Mo), and a molybdenum alloy. For example, the data metal line (171, 172, 174, 175, and 179) can be formed as a triple layer of titanium/aluminum/titanium (T1/Al/T1), a triple layer of molybdenum/aluminum/molybdenum (Mo/Al/Mo), or a triple layer of molybdenum/copper/molybdenum (Mo/Cu/Mo).

The data line 171 is connected to the switching source electrode 136 b through the switching contact hole 62 disposed in the first gate insulating layer 141, the second gate insulating layer 142, and the interlayer insulating layer 160. One end of the driving connecting member 174 is connected to the first storage electrode 155 a through the driving contact hole 61 disposed in the second gate insulating layer 142 and the interlayer insulating layer 160. And the other end of the driving connecting member 174 is connected to the compensation drain electrode 137 c and the initialization drain electrode 137 d through the compensation contact hole 63 disposed in the first gate insulating layer 141, the second gate insulating layer 142, and the interlayer insulating layer 160.

The initialization connecting member 175 substantially parallel to the data line 171 is connected to the initialization source electrode 136 d through the initialization contact hole 64 disposed in the first gate insulating layer 141, the second gate insulating layer 142, and the interlayer insulating layer 160. Also, the pixel connecting member 179 is connected to the light emission control drain electrode 137 f through the light emission control contact hole 66 disposed in the first gate insulating layer 141, the second gate insulating layer 142, and the interlayer insulating layer 160.

A passivation layer 180 covering the data metal line (171, 172, 174, 175, and 179) and the interlayer insulating layer 160 is disposed thereon. The passivation layer 180 covers the data metal line (171, 172, 174, 175, and 179) to be flattened such that the pixel electrode 191 can be disposed on the passivation layer 180 without a step. The passivation layer 180 can be formed of a stacked layer of an organic material such as a polyacrylate resin, a polyimide resin, or the like, or a stacked layer of an organic material and an inorganic material.

The pixel electrode 191 and the initialization voltage line 192 are disposed on the passivation layer 180. The light emission control connecting member 179 is connected to the pixel electrode 191 through the contact hole 81 disposed in the passivation layer 180. The initialization connecting member 175 is connected to the initialization voltage line 192 through the contact hole 82 disposed in the passivation layer 180.

A pixel definition layer (PDL) 350 covering the passivation layer 180, the initialization voltage line 192, and the edge of the pixel electrode 191 is disposed thereon. And the pixel definition layer 350 has a pixel opening 351 exposing the pixel electrode 191. The pixel definition layer 350 can be formed of organic materials such as a polyacrylate resin, a polyimide resin, and the like, and silica-based organic materials.

An organic emission layer 370 is disposed on the pixel electrode 191 exposed through the pixel opening 351 and a common electrode 270 is disposed on the organic emission layer 370. The common electrode 270 is also disposed on the pixel definition layer 350 over the plurality of pixels PX. As such, the OLED including the pixel electrode 191, the organic emission layer 370, and the common electrode 270 is formed.

Here, the pixel electrode 191 is an anode which is a hole injection electrode, and the common electrode 270 is a cathode which is an electron injection electrode. However, the exemplary embodiment according to the present disclosure is not necessarily limited thereto, and the pixel electrode 191 can be the cathode and the common electrode 270 can be the anode according to a driving method of the foldable display device. Holes and electrons are injected into the organic emission layer 370 from the pixel electrode 191 and the common electrode 270, respectively. And excitons generated by combining the injected holes and electrons fall from an excitation state to a ground state.

The organic emission layer 370 is formed of a low-molecular organic material or a high-molecular organic material such as poly(3,4-ethylenedioxythiophene) (PEDOT). Further, the organic emission layer 370 can be formed with multiple layers including at least one of an emission layer, a hole injection layer (HIL), a hole transporting layer (HTL), an electron transporting layer (ETL), and an electron injection layer (EIL). When the organic emission layer 370 includes all of the layers, the hole injection layer is disposed on the pixel electrode 191 which is the positive electrode. The hole transporting layer, the light emission layer, the electron transporting layer, and the electron injection layer are sequentially laminated thereon.

The organic emission layer 370 can include a red organic emission layer emitting red light, a green organic emission layer emitting green light, and a blue organic emission layer emitting blue light. The red organic emission layer, the green organic emission layer, and the blue organic emission layer are disposed at a red pixel, a green pixel, and a blue pixel, respectively, to implement color images.

Further, in the organic emission layer 370, all of the red organic emission layer, the green organic emission layer, and the blue organic emission layer are laminated together on the red pixel, the green pixel, and the blue pixel. A red color filter, a green color filter, and a blue color filter are formed for each pixel to implement the color images. As another example, a white organic emission layer emitting white light is formed on all of the red pixel, the green pixel, and the blue pixel. And the red color filter, the green color filter, and the blue color filter are formed for each pixel to implement the color images. When the color images are implemented by using the white organic emission layer and the color filters, in some embodiments, a deposition mask for depositing the red organic emission layer, the green organic emission layer, and the blue organic emission layer on individual pixels, that is, the red pixel, the green pixel, and the blue pixel, respectively, are not used.

The white organic emission layer described in another example can be formed by one organic emission layer, and can include a configuration that can emit white light by laminating a plurality of organic emission layers. As an example, the white organic emission layer includes a configuration that enables the white light to be emitted by combining at least one yellow organic emission layer and at least one blue organic emission layer. The white organic emission layer can include a configuration that enables the white light to be emitted by combining at least one cyan organic emission layer and at least one red organic emission layer, a configuration that enables the white light to be emitted by combining at least one magenta organic emission layer and at least one green organic emission layer, and the like.

An encapsulation member (not shown) protecting the OLED can be disposed on the common electrode 270. The encapsulation member can be sealed to the substrate 110 by a sealant and can be formed of various materials such as glass, quartz, ceramic, plastic, and a metal. A thin film encapsulation layer can be disposed on the common electrode 270 by depositing the inorganic layer and the organic layer with the usage of the sealant.

In the exemplary embodiment, the first non-contact semiconductor region is positioned on the shortest path passing in front of the compensation contact hole, but the first non-contact semiconductor region can be positioned on a detour path behind the compensation contact hole as another exemplary embodiment.

Next, the OLED display according to another exemplary embodiment of the present disclosure will be described with reference to FIG. 12 and FIG. 13.

Figure 12:
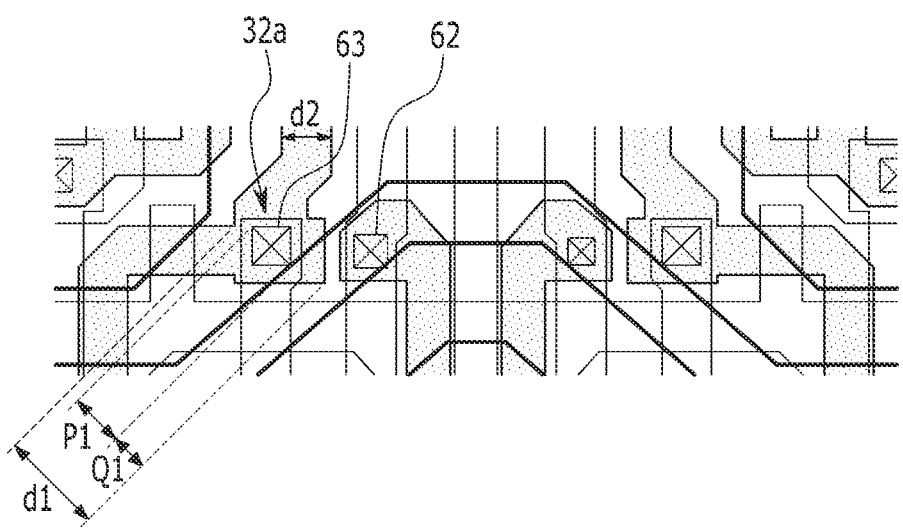
FIG. 12 is an enlarged layout view of a switching transistor T2 and a compensation transistor T3 of a red pixel and a green pixel of an OLED display according to another exemplary embodiment.

FIG. 12 is an enlarged layout view of a switching transistor T2 and a compensation transistor T3 of a red pixel and a green pixel of an OLED display according to another exemplary embodiment of the present disclosure. FIG. 13 is an enlarged layout view of a switching transistor T2 and a compensation transistor T3 when an interlayer alignment error is generated in FIG. 12.

Figure 13:
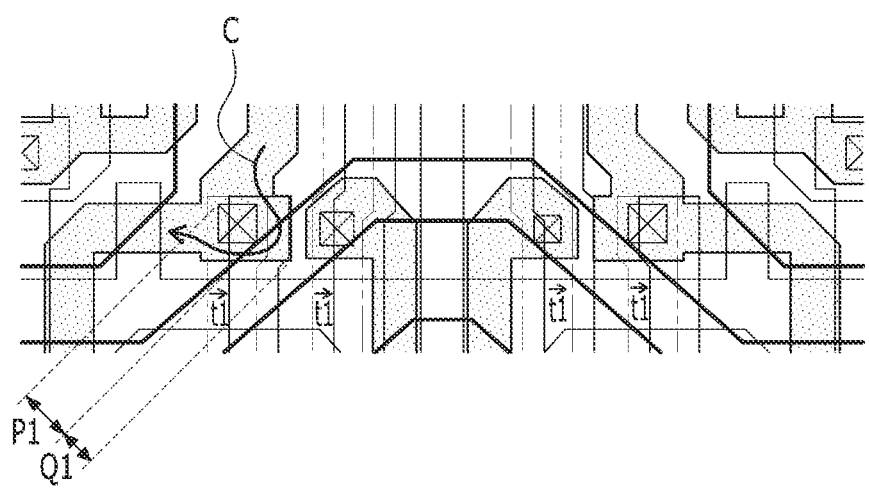
FIG. 13 is an enlarged layout view of a switching transistor T2 and a compensation transistor T3 when an interlayer alignment error is generated in FIG. 12.

The exemplary embodiment shown in FIG. 12 and FIG. 13 is substantially the same as the exemplary embodiment shown in FIG. 4, FIG. 5, FIG. 6, FIG. 7, FIG. 8, FIG. 9, FIG. 10, and FIG. 11 except for the first non-contact semiconductor region positioned on the detour path behind the compensation contact hole such that the repeated description is omitted.

As shown in FIG. 12, the width d1 of the first expansion semiconductor part 32 a of the OLED display according to the current exemplary embodiment of the present disclosure can be greater than the width d2 of the narrow semiconductor part. Also, the edge of the first expansion semiconductor part 32 a encloses the edge of the compensation contact hole 63. That is, the first expansion semiconductor part 32 a includes the first contact semiconductor region P1 overlapping the compensation contact hole 63 and the first non-contact semiconductor region Q1 that does not overlap the compensation contact hole 63. The edge of the first expansion semiconductor part 32 a and the edge of the compensation contact hole 63 are separated from each other in the first non-contact semiconductor region Q1. The first non-contact semiconductor region Q1 is positioned on the detour path C behind the compensation contact hole 63. Accordingly, the current movement path can be sufficiently obtained through the first non-contact semiconductor region Q1 disposed in the first expansion semiconductor part 32 a.

FIG. 13 is the enlarged layout view of the switching transistor T2 and the compensation transistor T3 when the interlayer alignment error is generated such that the data metal line is shifted to the right side in FIG. 12.

As shown in FIG. 13, when the interlayer alignment error is generated in the manufacturing process of the high resolution structure, the driving connecting member 174 and the data line 171 are shifted by a predetermined interval t1 to the right side with respect to the position to be disposed on the original design. Accordingly, one end of the driving connecting member 174 does not completely cover the compensation contact hole 63 such that a portion of the compensation contact hole 63 is exposed. The etchant penetrates through the exposed compensation contact hole 63 such that the portion of the first expansion semiconductor part 32 a is damaged. However, even if the first contact semiconductor region P1 of the first expansion semiconductor part 32 a is damaged, the first non-contact semiconductor region Q1 is not damaged such that the current movement path between the compensation drain electrode 137 c and the initialization drain electrode 137 d is obtained. The current movement path corresponds to the detour path C behind the compensation contact hole 63.

As described above, by forming the first non-contact semiconductor region Q1 corresponding to the detour path C behind the compensation contact hole 63 in the first expansion semiconductor part 32 a disposed at the position corresponding to the compensation contact hole 63, the current movement path can be sufficiently obtained in the first expansion semiconductor part 32 a. Accordingly, the opening of the first expansion semiconductor part 32 a that can be generated by the penetration of the etchant for the data metal line through the compensation contact hole 63 due to the interlayer alignment error can be prevented. Accordingly, the non-uniniform lighting between the adjacent pixels can be prevented in a high resolution structure.

On the other hand, in the exemplary embodiment, to prevent the opening of the semiconductor member, the width of the expansion semiconductor part is greater than the width of the narrow semiconductor part, but the width of the expansion data metal part can be greater than the width of the data metal part to prevent the opening of the semiconductor member as another exemplary embodiment.

Next, the OLED display according to another exemplary embodiment of the present disclosure will be described with reference to FIG. 14 and FIG. 15.

Figure 14:
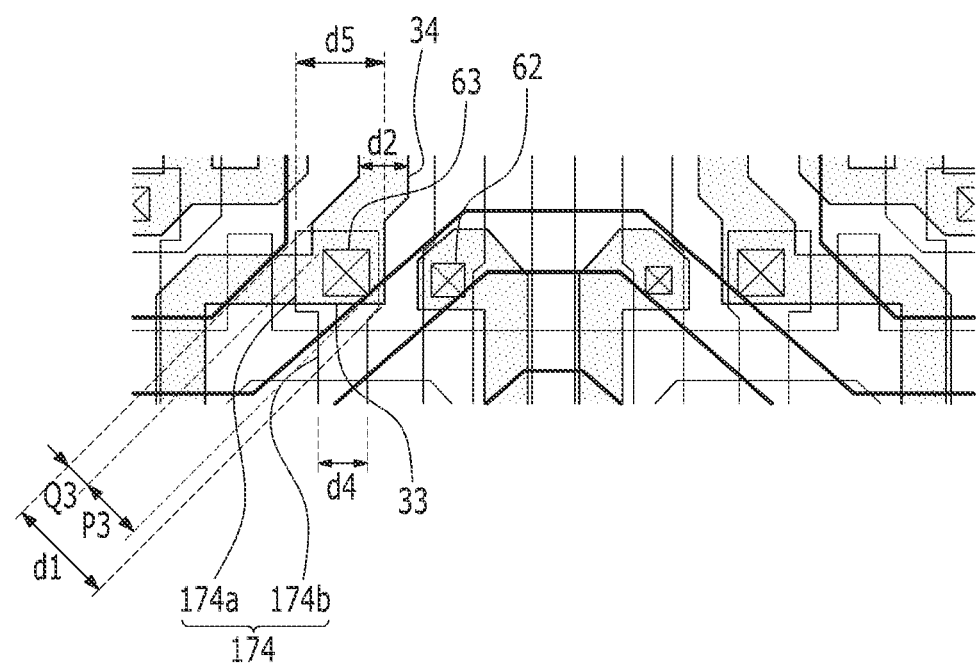
FIG. 14 is an enlarged layout view of a switching transistor T2 and a compensation transistor T3 of a red pixel and a green pixel of an OLED display according to another exemplary embodiment.

FIG. 14 is an enlarged layout view of a switching transistor T2 and a compensation transistor T3 of a red pixel and a green pixel of an OLED display according to another exemplary embodiment of the present disclosure. FIG. 15 is an enlarged layout view of a switching transistor T2 and a compensation transistor T3 when an interlayer alignment error is generated in FIG. 14.

Figure 15:
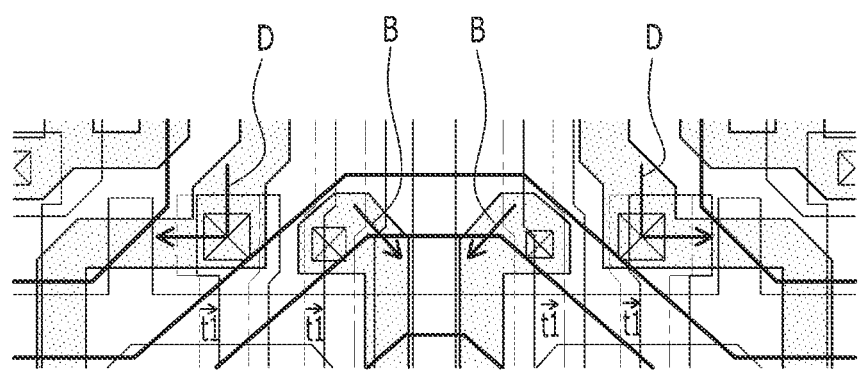
FIG. 15 is an enlarged layout view of a switching transistor T2 and a compensation transistor T3 when an interlayer alignment error is generated in FIG. 14.

The exemplary embodiment shown in FIG. 14 and FIG. 15 is the same as the exemplary embodiment shown in FIG. 4, FIG. 5, FIG. 6, FIG. 7, FIG. 8, FIG. 9, FIG. 10, and FIG. 11 except for the expansion data metal part having a greater width than the width of the normal data metal part such that the repeated description is omitted.

As shown in FIG. 14 and FIG. 15, the driving connecting member 174 as part of the data metal line (171, 172, 174, 175, and 179) of the OLED display according to the current exemplary embodiment of the present disclosure includes a driving connection portion 174 b as the normal data metal part having a first width d4 and a driving expansion part 174 a as the expansion data metal part having a second width d5 greater than the first width d4.

The normal data metal part 174 b corresponds to most of the data metal line such as the data line 171 and the driving voltage line 172.

The semiconductor member 130 includes a curved semiconductor part 33 disposed at a position corresponding to the compensation contact hole 63 and formed with a curved shape, and a semiconductor stripe part 34 formed with a stripe shape. The curved semiconductor part 33 overlaps the driving expansion part 174 a on the plane.

The edge of the driving expansion part 174 a encloses the edge of the compensation contact hole 63. That is, the driving expansion part 174 a includes a contact data region P3 overlapping the compensation contact hole 63 and a non-contact data region Q3 that does not overlap the compensation contact hole 63. The edge of the driving expansion part 174 a is separated from the edge of the compensation contact hole 63 in the non-contact data region Q3. Accordingly, the current movement path can be sufficiently obtained through the non-contact data region Q3 disposed in the driving expansion part 174 a.

FIG. 15 shows the enlarged layout view of the switching transistor T2 and the compensation transistor T3 when the interlayer alignment error is generated such that the driving connecting member is shifted to the right side in FIG. 14.

As shown in FIG. 15, when the interlayer alignment error is generated on the manufacturing process of the high resolution structure, the driving connecting member 174 and the data line 171 are shifted by a predetermined interval t1 to the right side with respect to the position to be disposed on the original design.

Accordingly, the driving expansion part 174 a of the green pixel G does not completely cover the compensation contact hole 63 such that the portion of the compensation contact hole 63 is exposed outside. The etchant penetrates through the exposed compensation contact hole 63 such that the portion of the curved semiconductor part 33 is damaged. However, although the portion of the curved semiconductor part 33 is damaged by the etchant, the current movement path D between the compensation drain electrode 137 c and the initialization drain electrode 137 d is obtained in the green pixel G.

In this case, the width d5 of the driving expansion part 174 a of the driving connecting member 174 is greater than the width d4 of the driving connection portion 174 b. The driving expansion part 174 a further encloses the compensation contact hole 63 by the non-contact data region Q3 such that the driving expansion part 174 a of the red pixel R completely covers the compensation contact hole 63 as it is, and thereby the curved semiconductor part 33 of the red pixel R is not damaged by the etchant.

Accordingly, the opening of the curved semiconductor part 33 that can be generated by the penetration of the etchant for the data metal line through the compensation contact hole 63 due to the interlayer alignment error can be prevented. Accordingly, the non-uniform lighting between the adjacent pixel in the high resolution structure can be prevented.

While the inventive technology has been described in connection with what is presently considered to be practical exemplary embodiments, it is to be understood that the disclosure is not limited to the disclosed embodiments, but, on the contrary, is intended to cover various modifications and equivalent arrangements included within the spirit and scope of the appended claims.

What is claimed is:

1. An organic light-emitting diode (OLED) display, comprising:
   a substrate;
   a semiconductor layer on the substrate;
   a scan line transmitting a scan signal and extending in a first direction on the semiconductor layer;
   an insulating layer on the scan line and having a contact hole overlapping the semiconductor layer;
   a data line transmitting a data signal and extending in a second direction perpendicular to the first direction on the insulating layer;
   a driving connector on the insulating layer and electrically connected to the semiconductor layer via the contact hole; and
   an OLED on the data line,
   wherein, in a plan view, the semiconductor layer includes a first semiconductor portion extending in the first direction, a second semiconductor portion extending in the second direction, and a third semiconductor portion between the first semiconductor portion and the second semiconductor portion and directly connected to the first semiconductor portion and the second semiconductor portion,
   wherein the third semiconductor portion has a shorter side extending only in a third direction different from the first direction and the second direction, one end of the shorter side being directly connected to the first semiconductor portion and another end of the shorter side being directly connected to the second semiconductor portion,
   wherein the third semiconductor portion has an expansion part protruding from the shorter side in a fourth direction crossing the third direction and having a maximum width, measured in the fourth direction, greater than a maximum width of the first semiconductor portion, measured in the second direction, and a maximum width of the second semiconductor portion, measured in the first direction, and
   wherein the contact hole overlaps the expansion part, and the driving connector electrically connects a gate electrode of a driving transistor to the expansion part via the contact hole.

2. The OLED display of claim 1, wherein the semiconductor layer comprises a channel region of the driving transistor, a channel region of a switching transistor, a channel region of an initialization transistor, and a channel region of a compensation transistor.

3. The OLED display of claim 2, wherein the first semiconductor portion comprises the channel region of the compensation transistor and the second semiconductor portion comprises the channel region of the initialization transistor.

4. The OLED display of claim 2, wherein the switching transistor is electrically connected to the scan line and the data line.

5. The OLED display of claim 2, wherein the driving transistor electrically connected to the switching transistor, the initialization transistor, and the compensation transistor.

6. The OLED display of claim 5, wherein a source electrode of the compensation transistor is electrically connected to a drain electrode of the driving transistor, and a drain electrode of the initialization transistor is electrically connected to the gate electrode of the driving transistor and a drain electrode of the compensation transistor.

7. The OLED display of claim 6, wherein the expansion part electrically connects the drain electrode of the compensation transistor to the drain electrode of the initialization transistor.

8. The OLED display of claim 2, further comprising: an initialization voltage line transmitting an initialization voltage that initializes the driving transistor and electrically connected to a drain electrode of the compensation transistor.

9. The OLED display of claim 1, wherein the third semiconductor portion encloses the contact hole.

10. The OLED display of claim 1 wherein the expansion part comprises a contact region overlapping the contact hole and a non-contact region not overlapping the contact hole, and wherein edges of the expansion part and edges of the contact hole are separated from each other in the non-contact region.

11. The OLED display of claim 1, wherein the driving connector crosses the scan line.

* * * * *